(12) United States Patent
Kim et al.

(10) Patent No.: US 9,252,244 B2
(45) Date of Patent: Feb. 2, 2016

(54) METHODS OF SELECTIVELY GROWING SOURCE/DRAIN REGIONS OF FIN FIELD EFFECT TRANSISTOR AND METHOD OF MANUFACTURING SEMICONDUCTOR DEVICE INCLUDING A FIN FIELD EFFECT TRANSISTOR

(71) Applicant: Samsung Electronics Co., Ltd., Suwon-si (KR)

(72) Inventors: JinBum Kim, Seoul (KR); Seong Hoon Jeong, Seongnam-si (KR); Jeon Il Lee, Suwon-si (KR); Seokhoon Kim, Suwon-si (KR); Kwan Heum Lee, Suwon-si (KR); Choeun Lee, Pocheon-si (KR); Yu-Jin Pyo, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/498,996

(22) Filed: Sep. 26, 2014

(65) Prior Publication Data
US 2015/0206955 A1   Jul. 23, 2015

(30) Foreign Application Priority Data

Jan. 21, 2014   (KR) .................... 10-2014-0007351

(51) Int. Cl.
| H01L 21/336 | (2006.01) |
| H01L 29/66  | (2006.01) |
| H01L 29/51  | (2006.01) |
| H01L 29/161 | (2006.01) |

(Continued)

(52) U.S. Cl.
CPC ...... *H01L 29/66795* (2013.01); *H01L 21/0223* (2013.01); *H01L 21/02252* (2013.01); *H01L 29/161* (2013.01); *H01L 29/517* (2013.01); *H01L 29/6656* (2013.01); *H01L 21/823418* (2013.01); *H01L 21/823431* (2013.01); *H01L 21/823821* (2013.01); *H01L 27/1211* (2013.01); *H01L 29/785* (2013.01)

(58) Field of Classification Search
CPC .......... H01L 29/785; H01L 29/66795; H01L 27/1211; H01L 21/82318; H01L 21/823431; H01L 21/823814; H01L 21/823821
USPC ......................................... 438/300
See application file for complete search history.

(56) References Cited

U.S. PATENT DOCUMENTS

| 5,168,072 A | * | 12/1992 | Moslehi | ............ H01L 21/32051 |
| | | | | 257/327 |
| 5,612,249 A | * | 3/1997 | Sun | .................... H01L 21/28123 |
| | | | | 257/E21.206 |

(Continued)

FOREIGN PATENT DOCUMENTS

| KR | 2006100092 | * | 9/2006 | .......... H01L 21/8247 |
| KR | 2008028162 | * | 3/2008 | .......... H01L 21/8247 |
| KR | 20080099900 | * | 5/2008 | ............ H01L 21/336 |

*Primary Examiner* — Mary Wilczewski
(74) *Attorney, Agent, or Firm* — Muir Patent Law, PLLC

(57) ABSTRACT

The inventive concepts provide methods of manufacturing a semiconductor device. The method includes patterning a substrate to form an active pattern, forming a gate pattern intersecting the active pattern, forming a gate spacer on a sidewall of the gate pattern, forming a growth-inhibiting layer covering an upper region of the gate pattern, and forming source/drain electrodes at opposite first and second sides of the gate pattern.

19 Claims, 40 Drawing Sheets

(51) Int. Cl.
  *H01L 21/02* (2006.01)
  *H01L 29/78* (2006.01)
  *H01L 21/8238* (2006.01)
  *H01L 21/8234* (2006.01)
  *H01L 27/12* (2006.01)

(56) References Cited

U.S. PATENT DOCUMENTS

| | | | | |
|---|---|---|---|---|
| 6,013,927 | A * | 1/2000 | Bothra | H01L 21/28525 257/328 |
| 6,162,717 | A * | 12/2000 | Yeh | H01L 21/28061 257/E21.2 |
| 6,165,826 | A * | 12/2000 | Chau | H01L 21/2254 257/E21.148 |
| 6,287,924 | B1 * | 9/2001 | Chao | H01L 21/28052 257/E21.199 |
| 6,337,246 | B1 * | 1/2002 | Sobek | H01L 21/28273 257/E21.209 |
| 6,599,792 | B2 * | 7/2003 | Jung | H01L 21/28247 257/E21.251 |
| 6,635,938 | B1 * | 10/2003 | Nakahata | H01L 21/823418 257/382 |
| 6,713,392 | B1 * | 3/2004 | Ngo | H01L 29/665 257/E21.438 |
| 6,746,925 | B1 * | 6/2004 | Lin | H01L 21/28247 257/E21.301 |
| 7,273,638 | B2 * | 9/2007 | Belyansky et al. | 427/539 |
| 7,667,271 | B2 | 2/2010 | Yu et al. | |
| 7,906,440 | B2 * | 3/2011 | Sasaki | H01J 37/32192 438/197 |
| 7,935,590 | B2 | 5/2011 | Lan et al. | |
| 8,105,958 | B2 * | 1/2012 | Kabe | H01J 37/32192 257/E21.179 |
| 8,114,746 | B2 | 2/2012 | Wei et al. | |
| 8,207,044 | B2 * | 6/2012 | Mani | H01L 21/0223 257/E21.171 |
| 8,313,999 | B2 | 11/2012 | Cappellani et al. | |
| 8,685,825 | B2 * | 4/2014 | Tang et al. | 438/341 |
| 8,987,837 | B2 * | 3/2015 | Cheng et al. | 257/401 |
| 2003/0030077 | A1 * | 2/2003 | Jung | H01L 21/28247 257/213 |
| 2005/0199948 | A1 | 9/2005 | Lee et al. | |
| 2005/0285162 | A1 * | 12/2005 | Kim | H01L 27/0688 257/288 |
| 2006/0003565 | A1 * | 1/2006 | Sasaki | H01L 21/28044 438/592 |
| 2006/0071275 | A1 * | 4/2006 | Brask et al. | 257/350 |
| 2006/0081916 | A1 * | 4/2006 | Sohn | H01L 21/28273 257/321 |
| 2007/0155075 | A1 * | 7/2007 | Kim | H01L 21/823412 438/197 |
| 2007/0196961 | A1 * | 8/2007 | Vitale | H01L 21/28123 438/147 |
| 2007/0221294 | A1 * | 9/2007 | Sasaki | H01J 37/32192 148/222 |
| 2007/0224836 | A1 * | 9/2007 | Sasaki | H01L 21/0223 438/763 |
| 2008/0032511 | A1 * | 2/2008 | Kabe | H01J 37/32192 438/771 |
| 2008/0048262 | A1 | 2/2008 | Lee et al. | |
| 2008/0146041 | A1 * | 6/2008 | Sasaki | H01J 37/32192 438/772 |
| 2009/0047778 | A1 * | 2/2009 | Sasaki | H01J 37/32192 438/594 |
| 2009/0057765 | A1 * | 3/2009 | Zhu et al. | 257/351 |
| 2009/0163010 | A1 * | 6/2009 | Oh | H01L 21/76832 438/587 |
| 2009/0239368 | A1 * | 9/2009 | Park | H01L 21/02164 438/592 |
| 2010/0038679 | A1 * | 2/2010 | Chan | H01L 29/66795 257/190 |
| 2010/0267248 | A1 * | 10/2010 | Ma | H01L 21/02164 438/787 |
| 2011/0210393 | A1 | 9/2011 | Chen et al. | |
| 2011/0227162 | A1 | 9/2011 | Lin et al. | |
| 2011/0309333 | A1 * | 12/2011 | Cheng | B82Y 10/00 257/24 |
| 2013/0154006 | A1 | 6/2013 | Basker et al. | |
| 2013/0228876 | A1 | 9/2013 | Mor et al. | |
| 2014/0151806 | A1 * | 6/2014 | Basker | H01L 29/66795 257/347 |
| 2014/0273368 | A1 * | 9/2014 | Hung | H01L 29/6656 438/230 |
| 2015/0035016 | A1 * | 2/2015 | Ganz | 257/288 |
| 2015/0187661 | A1 * | 7/2015 | Lii | H01L 21/823864 438/230 |

* cited by examiner

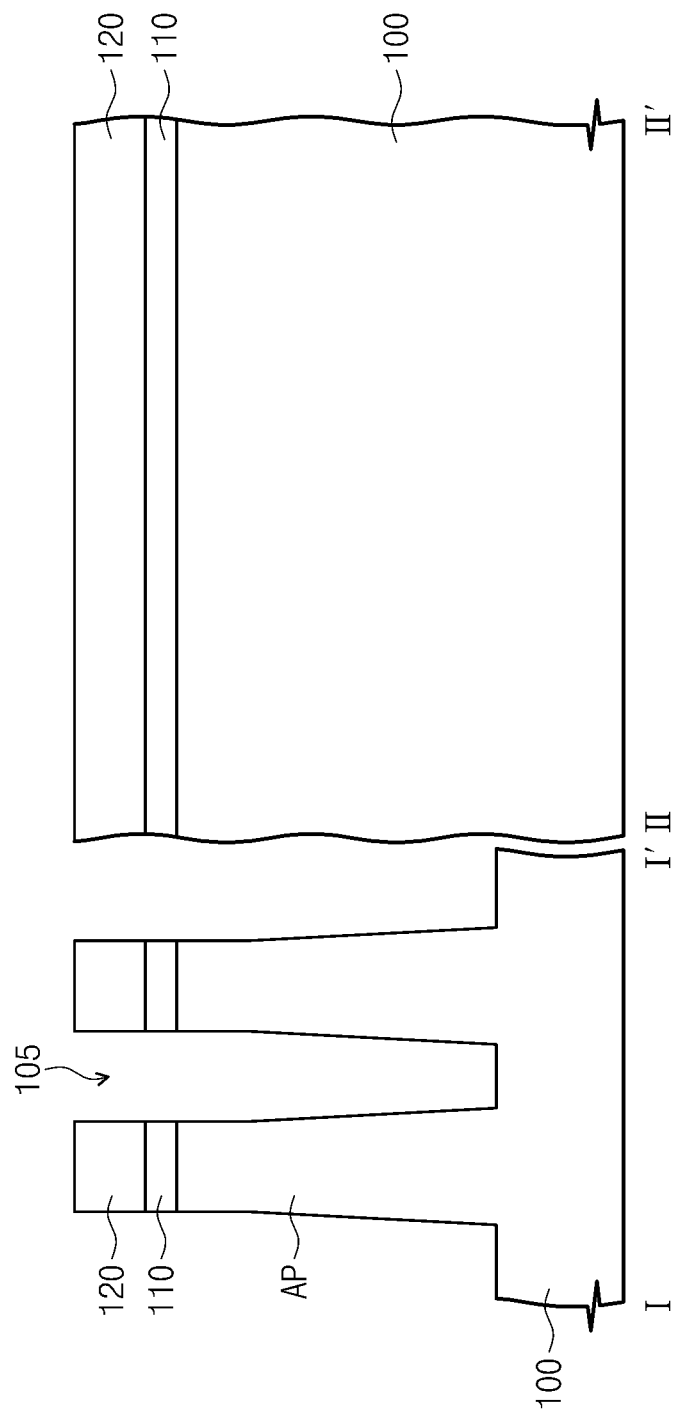

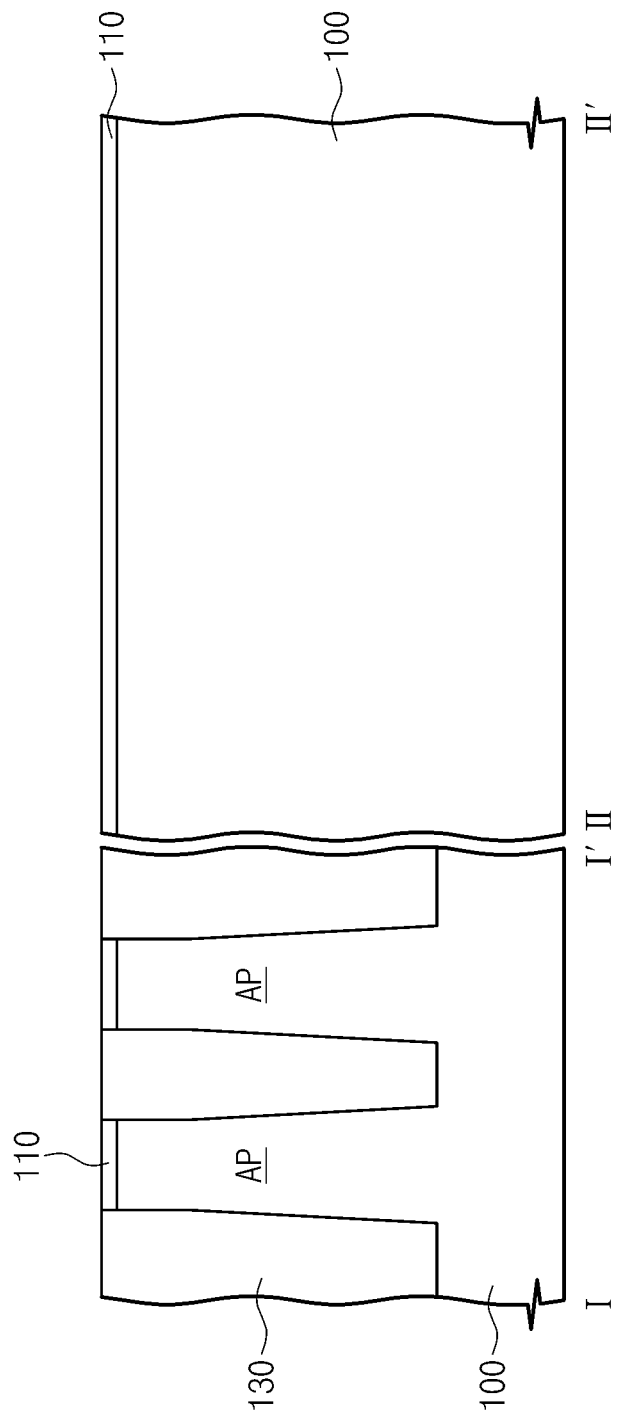

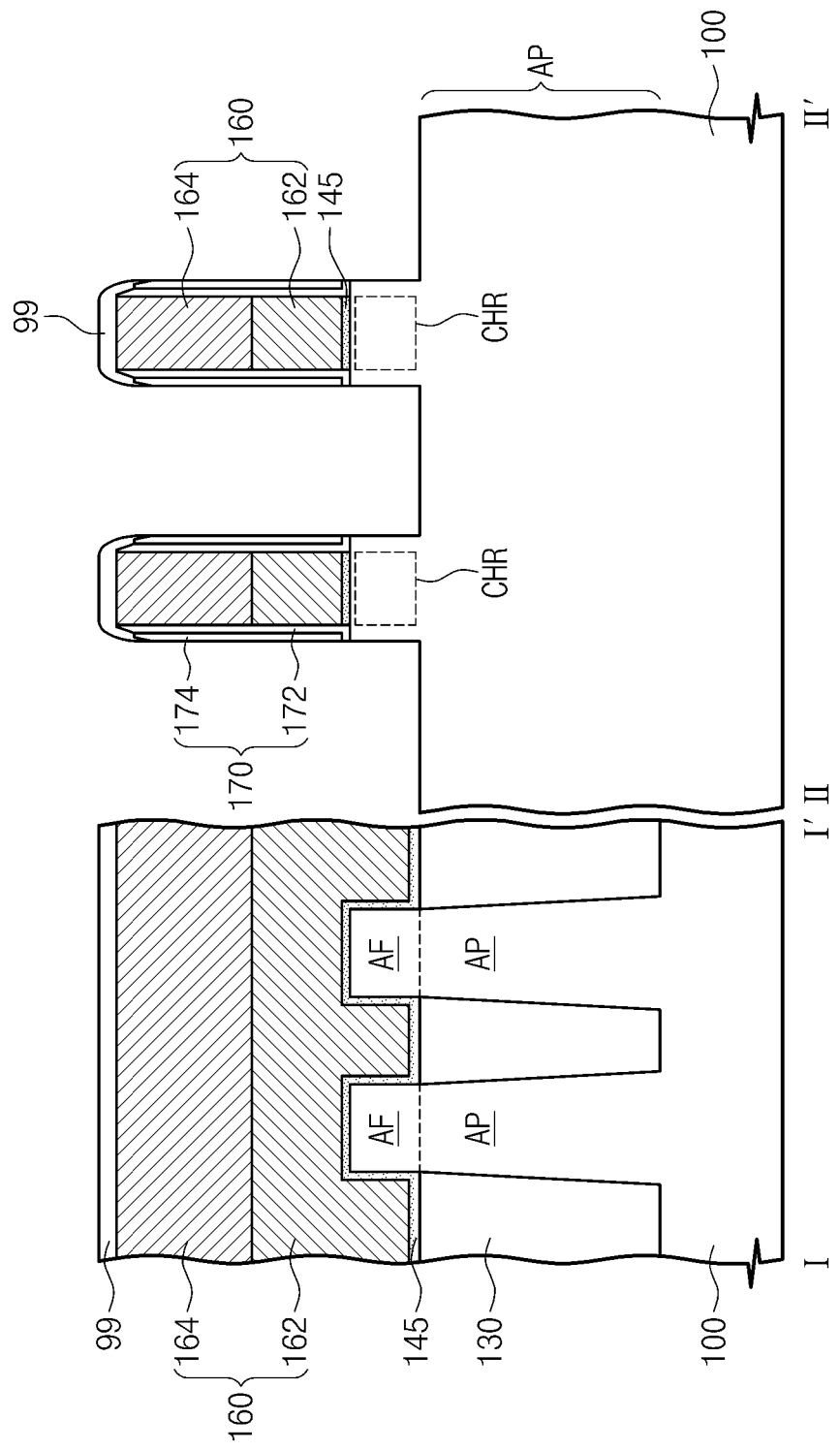

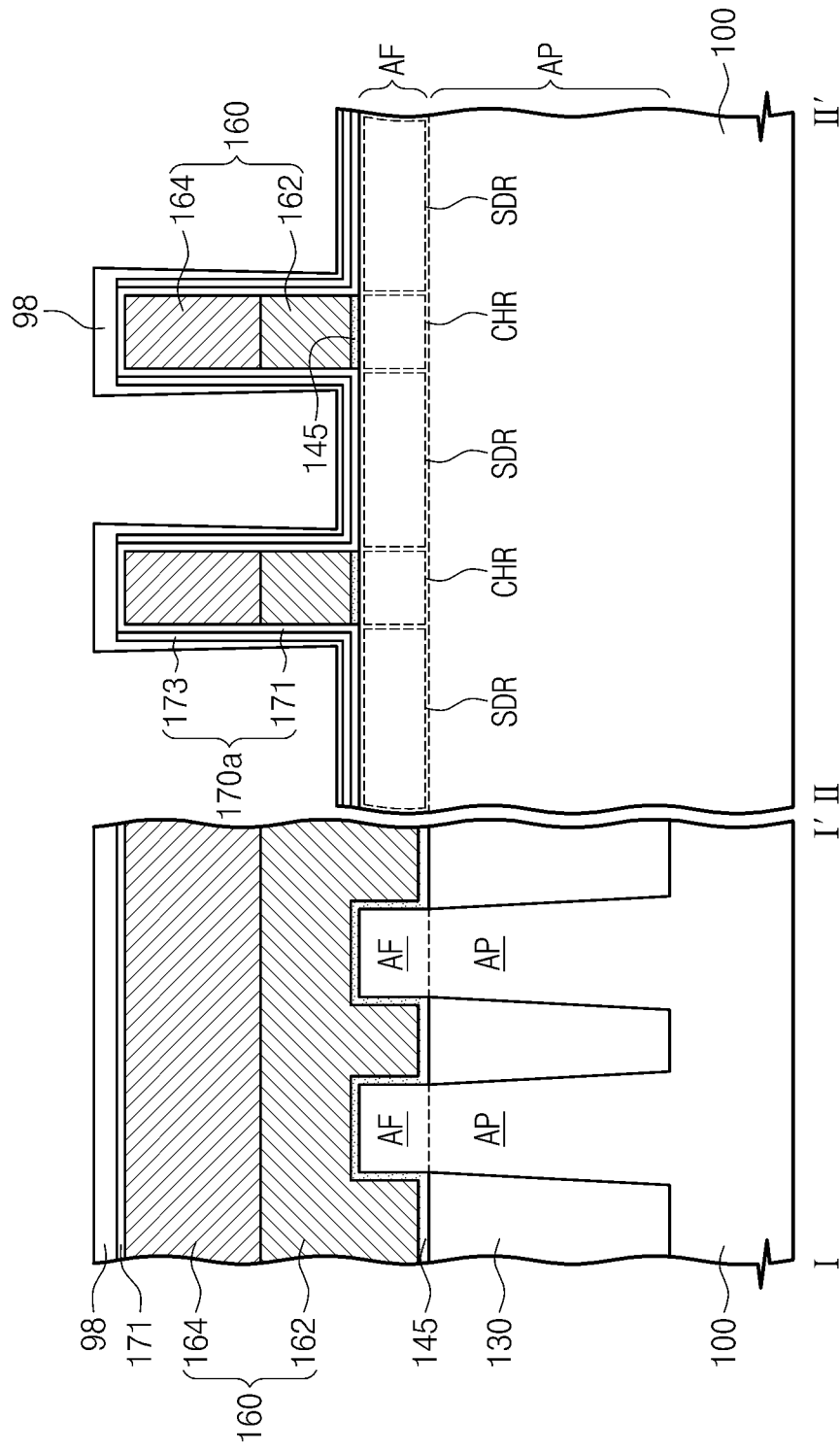

US 9,252,244 B2

METHODS OF SELECTIVELY GROWING SOURCE/DRAIN REGIONS OF FIN FIELD EFFECT TRANSISTOR AND METHOD OF MANUFACTURING SEMICONDUCTOR DEVICE INCLUDING A FIN FIELD EFFECT TRANSISTOR

CROSS-REFERENCE TO RELATED APPLICATION

This U.S. non-provisional patent application claims priority under 35 U.S.C. §119 to Korean Patent Application No. 10-2014-0007351, filed on Jan. 21, 2014, in the Korean Intellectual Property Office, the disclosure of which is hereby incorporated by reference in its entirety.

BACKGROUND

The present disclosure relates to methods of manufacturing a semiconductor device and, more particularly, to methods of selectively growing source/drain regions of a fin field effect transistor.

As semiconductor devices are highly integrated, it is increasingly difficult to realize the desired performance of transistors. Various structures of transistors are being developed to overcome the performance inadequacies. For example, researches are being conducted for a field effect transistor including a high-k dielectric layer and a metal gate fin.

SUMMARY

Embodiments of the inventive concepts may provide methods of selectively growing source/drain regions of a fin field effect transistor.

In an aspect, a method of manufacturing a semiconductor device may include: patterning a substrate to form an active pattern; forming a gate pattern intersecting the active pattern; forming a gate spacer on a sidewall of the gate pattern; forming a growth-inhibiting layer covering an upper region of the gate pattern; and forming source/drain electrodes at opposite first and second sides of the gate pattern. The growth-inhibiting layer may be formed by a plasma oxidation process.

In some embodiments, the gate pattern may include a gate dielectric pattern, a first gate pattern, and a second gate pattern which are sequentially stacked. The gate dielectric pattern may include at least one of hafnium oxide, hafnium silicate, zirconium oxide, or zirconium silicate, and the second gate pattern may include a silicon nitride-based material.

In some embodiments, forming the gate spacer may include: forming a first gate spacer layer covering the sidewall of the gate pattern; forming a second gate spacer layer covering the first gate spacer layer; and etching the first and second gate spacer layers to form first and second spacers exposing portions of the active pattern, the exposed portions of the active pattern disposed at the opposite first and second sides of the gate pattern. The first gate spacer layer may include a silicon nitride-based material, and the second gate spacer layer may include a silicon oxycarbonitride (SiOCN)-based material.

In some embodiments, the first gate spacer may expose an upper portion of the second gate pattern, and the second gate spacer may expose an upper portion of the first gate spacer. In this case, the plasma oxidation process may convert the exposed portions of the second gate pattern and the first gate spacer into an oxide-based material.

In some embodiments, the oxide-based material includes silicon oxynitride.

In some embodiments, the method may further include: recessing the exposed portions of the active pattern disposed at the opposite first and second sides of the gate pattern after the formation of the first and second gate spacers. The growth-inhibiting layer may expose the recessed portions of the active pattern.

In some embodiments, the method may further include: sequentially forming first and second gate spacer layers covering the gate pattern before the formation of the growth-inhibiting layer. In this case, forming the gate spacer may include etching the first and second gate spacer layers to form first and second gate spacers exposing portions of the active pattern disposed at the opposite first and second sides of the gate pattern.

In some embodiments, the first gate spacer layer may include a silicon oxide-based material, and the second gate spacer layer may include a silicon nitride-based material or a silicon oxycarbonitride (SiOCN)-based material.

In some embodiments, the plasma oxidation process may convert an upper portion of the second gate spacer layer into an oxide-based material.

In some embodiments, the method may further include: recessing the exposed portions of the active pattern disposed at the opposite first and second sides of the gate pattern after the formation of the growth-inhibiting layer. The growth-inhibiting layer may be formed to expose the recessed portions of the active pattern.

In some embodiments, the growth-inhibiting layer may be formed to cover an outer sidewall of the gate spacer.

In some embodiments, forming the growth-inhibiting layer may include: forming a preliminary growth-inhibiting layer on an upper portion of the gate pattern and on an upper portion of the active pattern, the preliminary growth-inhibiting layer being thicker on the upper portion of the gate pattern than on the upper portion of the active pattern; and performing an isotropic etching process to expose the upper portion of the active pattern. The source/drain electrodes may be grown from the exposed portions of the active pattern by an epitaxial technique.

In some embodiments, the plasma oxidation process may be performed at a chamber pressure in a range of 1 Torr to 30 Torr without applying a back-bias.

In some embodiments, the growth-inhibiting layer on the gate pattern may have a thickness in a range of about 40 Å to about 200 Å.

In an aspect, a method of manufacturing a semiconductor device may includes providing a substrate having an active pattern; forming a gate pattern intersecting the active pattern; forming a gate spacer on a sidewall of the gate pattern; forming a growth-inhibiting pattern covering an upper region of the gate pattern and exposing portions of the active pattern, the exposed portions of the active pattern are disposed at opposite first and second sides of the gate pattern; and forming source/drain patterns at the exposed portions of the active pattern, wherein forming the growth-inhibiting pattern may includes forming a preliminary growth-inhibiting layer on the gate pattern and the active pattern, wherein the preliminary growth-inhibiting layer disposed on the gate pattern is thicker than the preliminary growth-inhibiting pattern disposed on the active pattern; and removing the preliminary growth-inhibiting layer disposed on the active pattern to expose the portions of the active pattern.

In some embodiments, the gate pattern comprises a gate dielectric pattern, a first gate pattern, and a second gate pattern which are sequentially stacked, wherein the second gate pattern includes a silicon nitride-based material, wherein forming the preliminary growth-inhibiting pattern comprises converting an upper portion of the second gate pattern into an oxide-based material by a plasma oxidation process.

In some embodiments, the gate spacer comprises a first gate spacer and a second gate spacer which are sequentially stacked, wherein one of the first gate spacer and the second gate spacer includes a silicon nitride-based material, wherein forming the preliminary growth-inhibiting pattern comprises converting an exposed portion of the one of the first and the second gate spacers into an oxide-based material by the plasma oxidation process.

In some embodiments, wherein forming the source/drain patterns comprises growing silicon-geranium patterns from the exposed portions of the active pattern by an epitaxial technique.

In some embodiments, the method may further include: removing at least a portion of the gate pattern to form a gap region after the formation of the source/drain electrodes; and forming a gate electrode filling the gap region.

In some embodiments, the growth-inhibiting layer may expose portions of the active pattern which are disposed at both sides of the gate pattern, and forming the source/drain electrodes may include: growing silicon-germanium patterns from the exposed portions of the active pattern. The growth-inhibiting layer may be formed of a material capable of inhibiting growth of the silicon-germanium pattern.

BRIEF DESCRIPTION OF THE DRAWINGS

Various aspects of the inventive concepts will become more apparent in view of the attached drawings and accompanying detailed description.

FIGS. 2A to 13A are perspective views illustrating a method of manufacturing a semiconductor device according to some embodiments of the inventive concepts;

FIGS. 2B to 13B are exemplary cross-sectional views taken along lines I-I' and II-II' of FIGS. 2A to 13A, respectively;

FIGS. 16A to 21A are perspective views illustrating a method of manufacturing a semiconductor device according to other embodiments of the inventive concepts;

FIGS. 16B to 21B are exemplary cross-sectional views taken along lines I-I' and II-II' of FIGS. 16A to 21A, respectively.

DETAILED DESCRIPTION OF THE EMBODIMENTS

Figure 1:
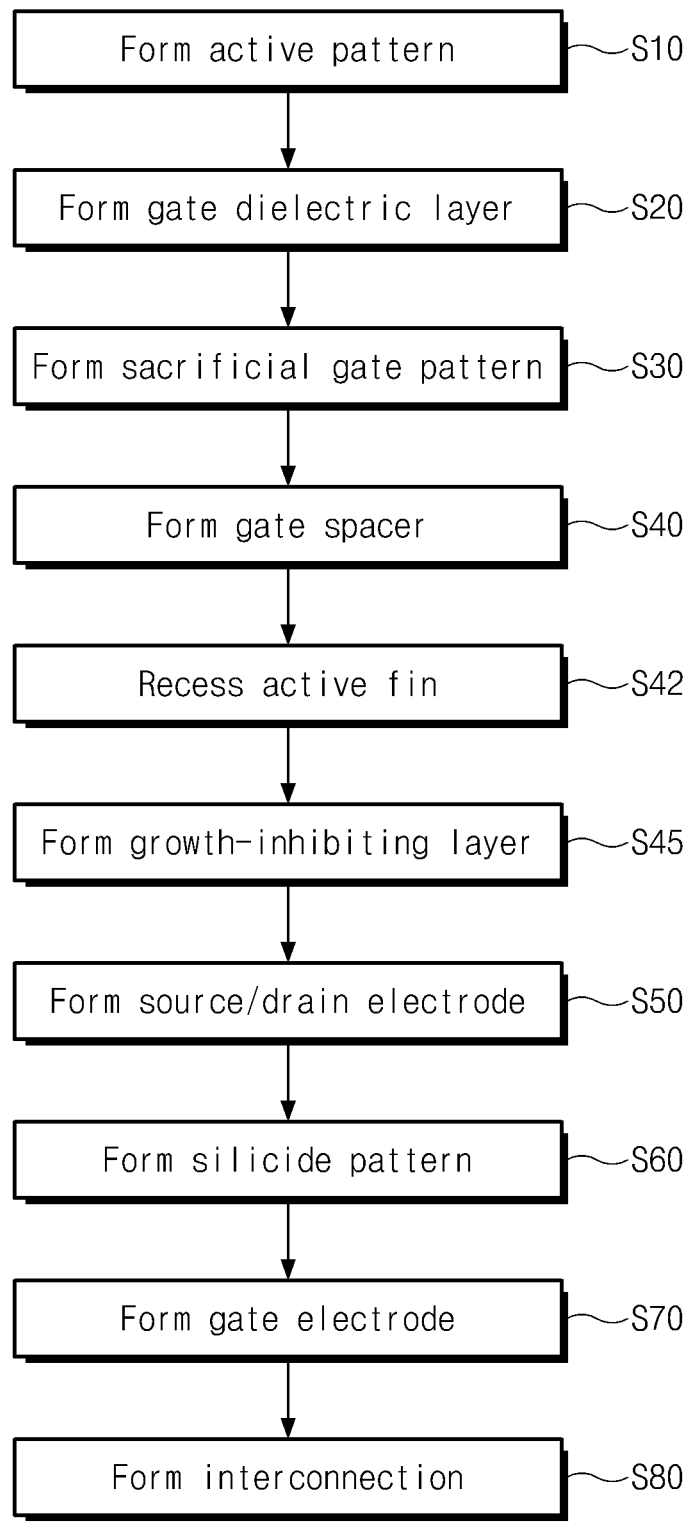
FIG. 1 is a flowchart illustrating a method of manufacturing a semiconductor device according to some embodiments of the inventive concepts.

Various aspects of the inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Similarly, "contact," as used herein indicates a direct contact—i.e., touching. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element, for example as a naming convention. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The terms "substantially" and/or "about" may be used herein to reflect this meaning.

FIG. 1 is a flowchart illustrating a method of manufacturing a semiconductor device according to some embodiments of the inventive concepts. FIGS. 2A to 13A are perspective views illustrating a method of manufacturing a semiconductor device according to some embodiments of the inventive concepts, and FIGS. 2B to 13B are cross-sectional views taken along lines I-I' and II-II' of FIGS. 2A to 13A, respectively.

Figure 2A:
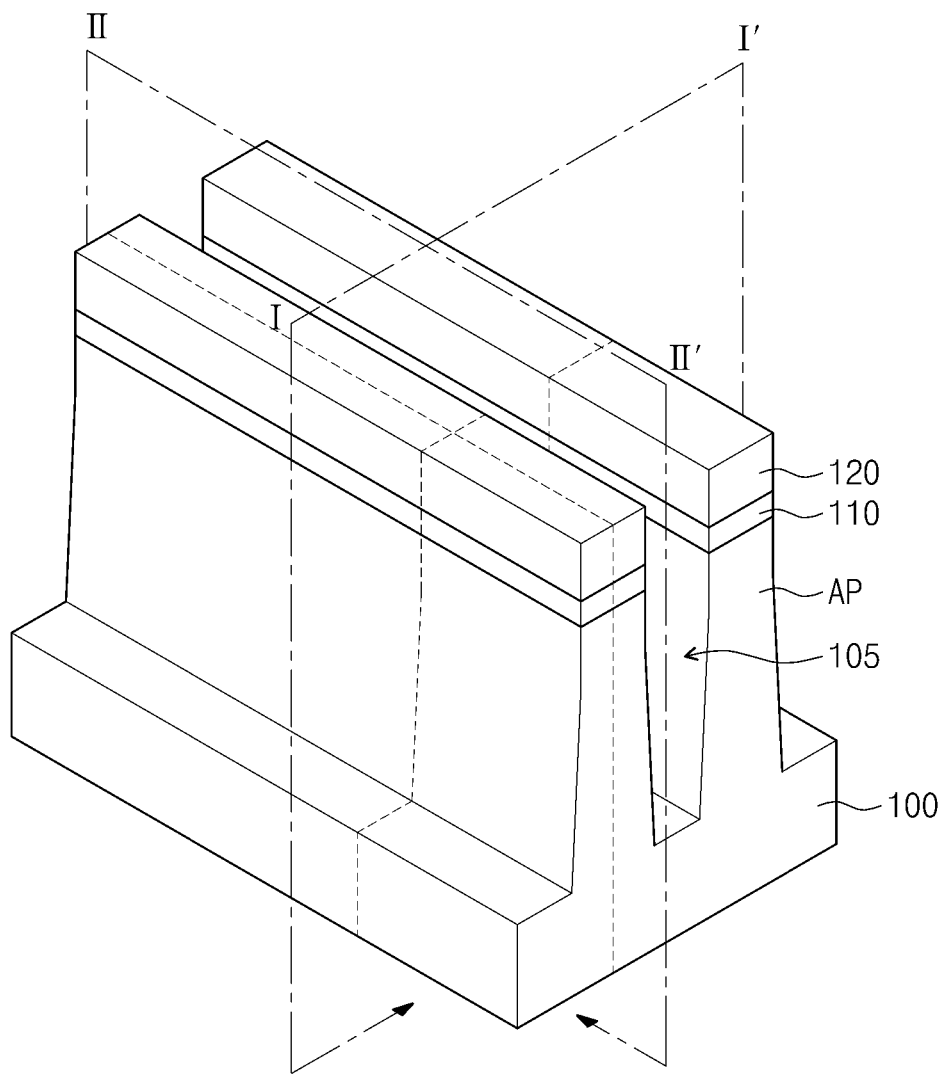

Referring to FIGS. 1, 2A, and 2B, a substrate 100 is patterned to form device isolation trenches 105 defining active patterns AP (S10). The substrate 100 may be a bulk silicon wafer or a silicon-on-insulator (SOI) wafer. For the purpose of ease and convenience in explanation, the substrate 100 of the bulk silicon wafer will be described as an embodiment hereinafter. However, the inventive concepts are not limited thereto.

The formation process of the device isolation trenches 105 may include forming mask patterns on the substrate 100 and anisotropically etching the substrate 100 using the mask patterns as an etch mask. According to some embodiments, the mask pattern may include a first mask pattern 110 and a second mask pattern 120 which have an etch selectivity with respect to each other and are sequentially stacked. Each of the device isolation trenches 105 may be formed to have an aspect ratio, for example, of 5 or more. In some embodiments, each of the device isolation trenches 105 may become progressively narrower toward its bottom. Thus, each of the active patterns AP may be formed to have a shape becoming progressively narrower toward its top.

Figure 3A:
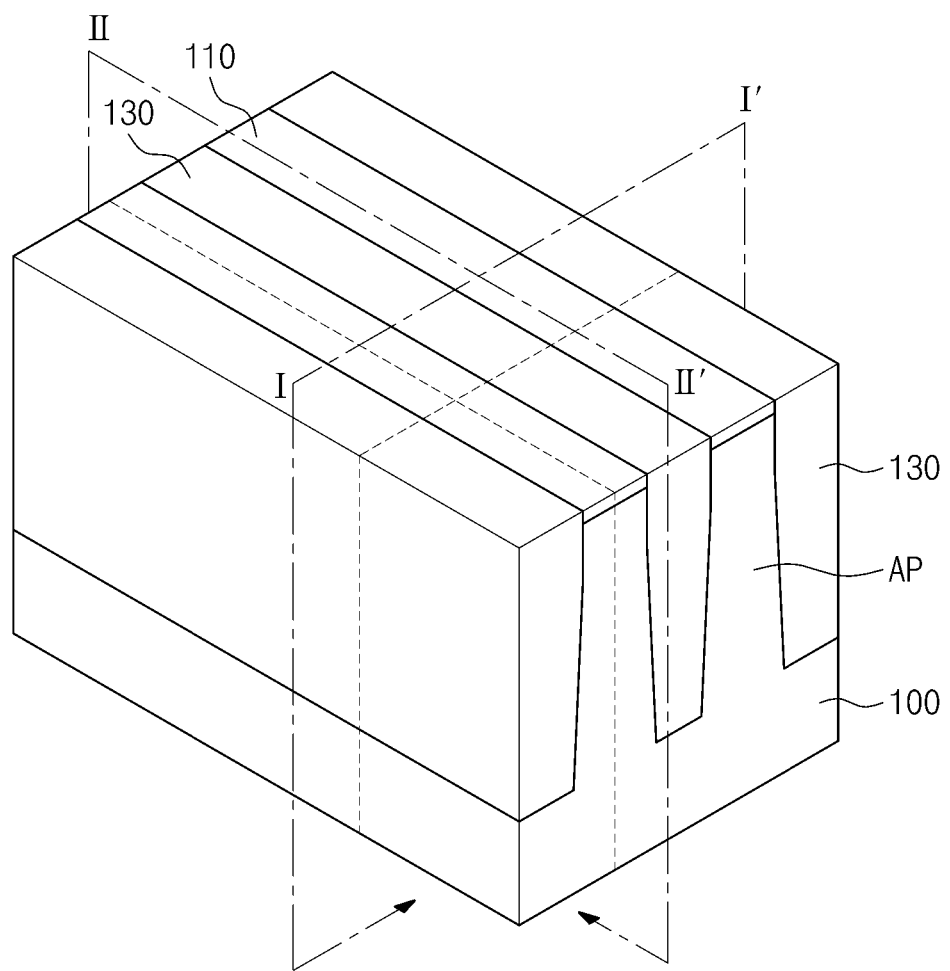

Referring to FIGS. 3A and 3B, device isolation patterns 130 are formed to fill the device isolation trenches 105. The formation process of the device isolation patterns 130 may include forming a device isolation layer filling the device isolation trenches 105 and planarizing the device isolation layer to expose a top surface of the mask pattern. Thus, the device isolation patterns 130 may be locally formed in the device isolation trenches 105, respectively.

Figure 4A:
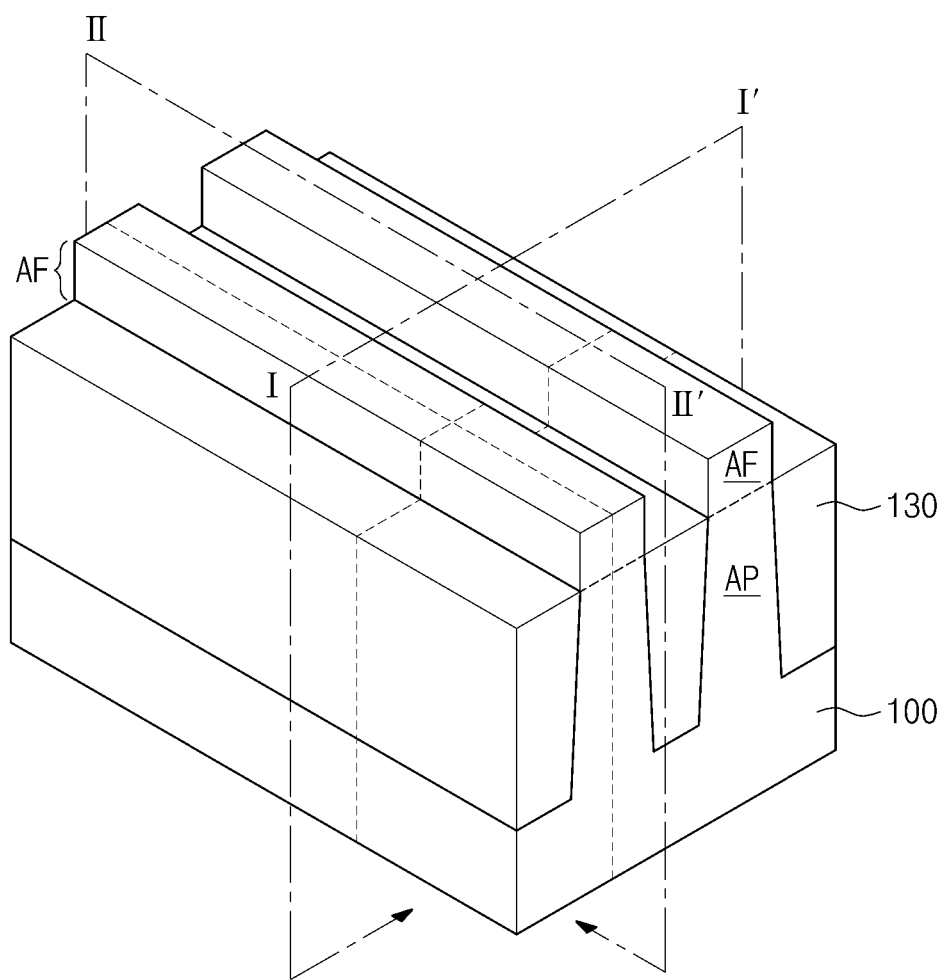
Figure 4B:
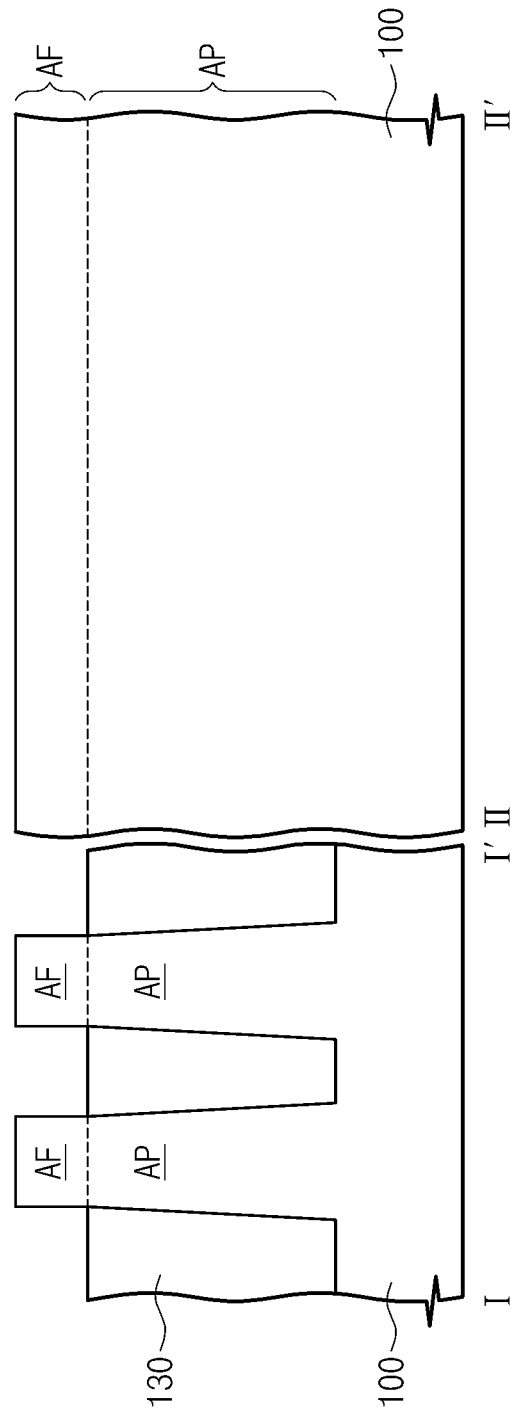

Referring to FIGS. 4A and 4B, upper portions (hereinafter, referred to as 'active fins AF') of the active patterns AP are exposed. The active fins AF may be exposed by recessing top surfaces of the device isolation patterns 130. For example, the top surfaces of the device isolation patterns 130 may be recessed using a wet etching technique. The device isolation patterns 130 may be recessed using an etch recipe having an etch selectivity with respect to the active patterns AP. The mask pattern may be removed during the etching of the device isolation patterns 130, and thus, top surfaces of the active fins AF may be exposed.

Figure 5A:
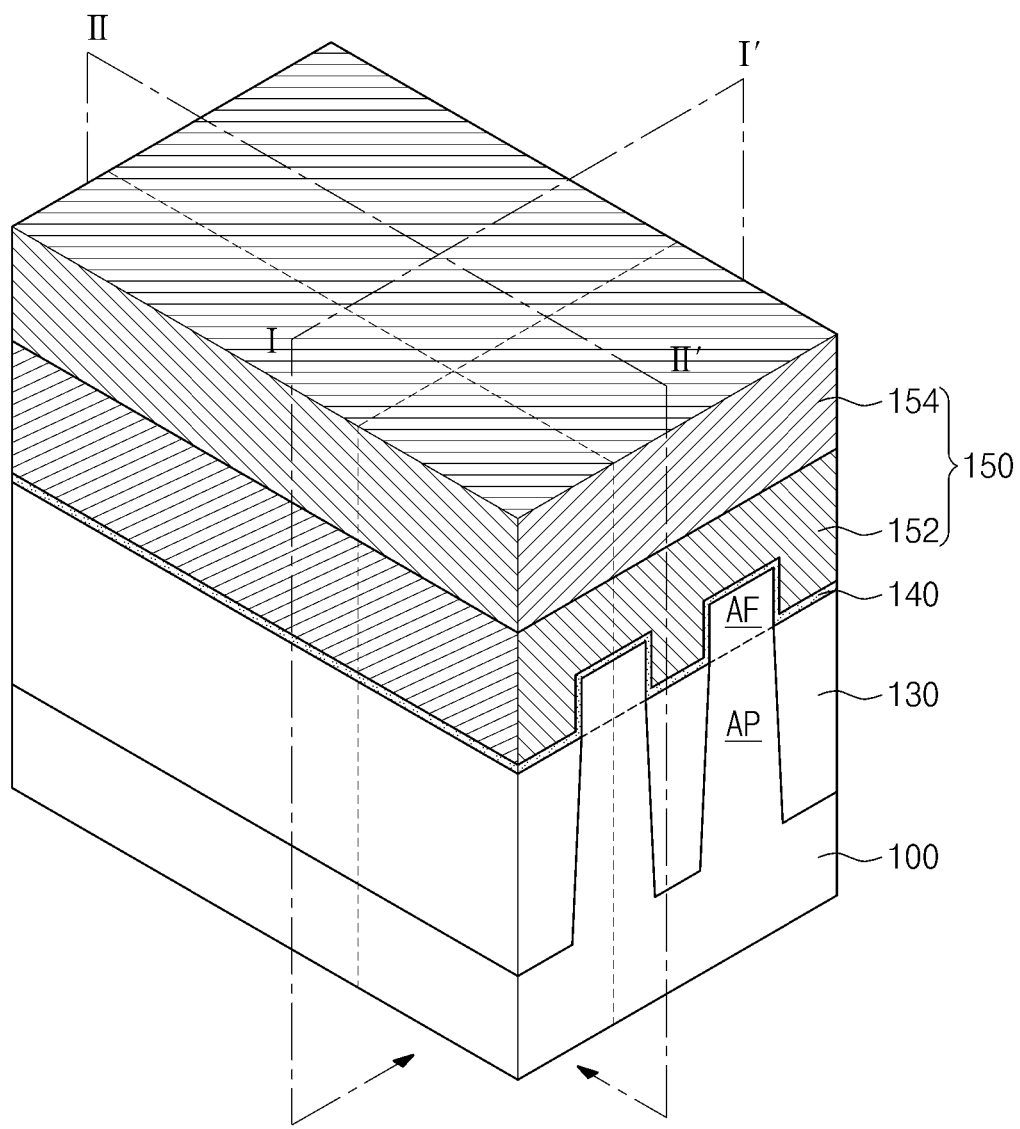
Figure 5B:
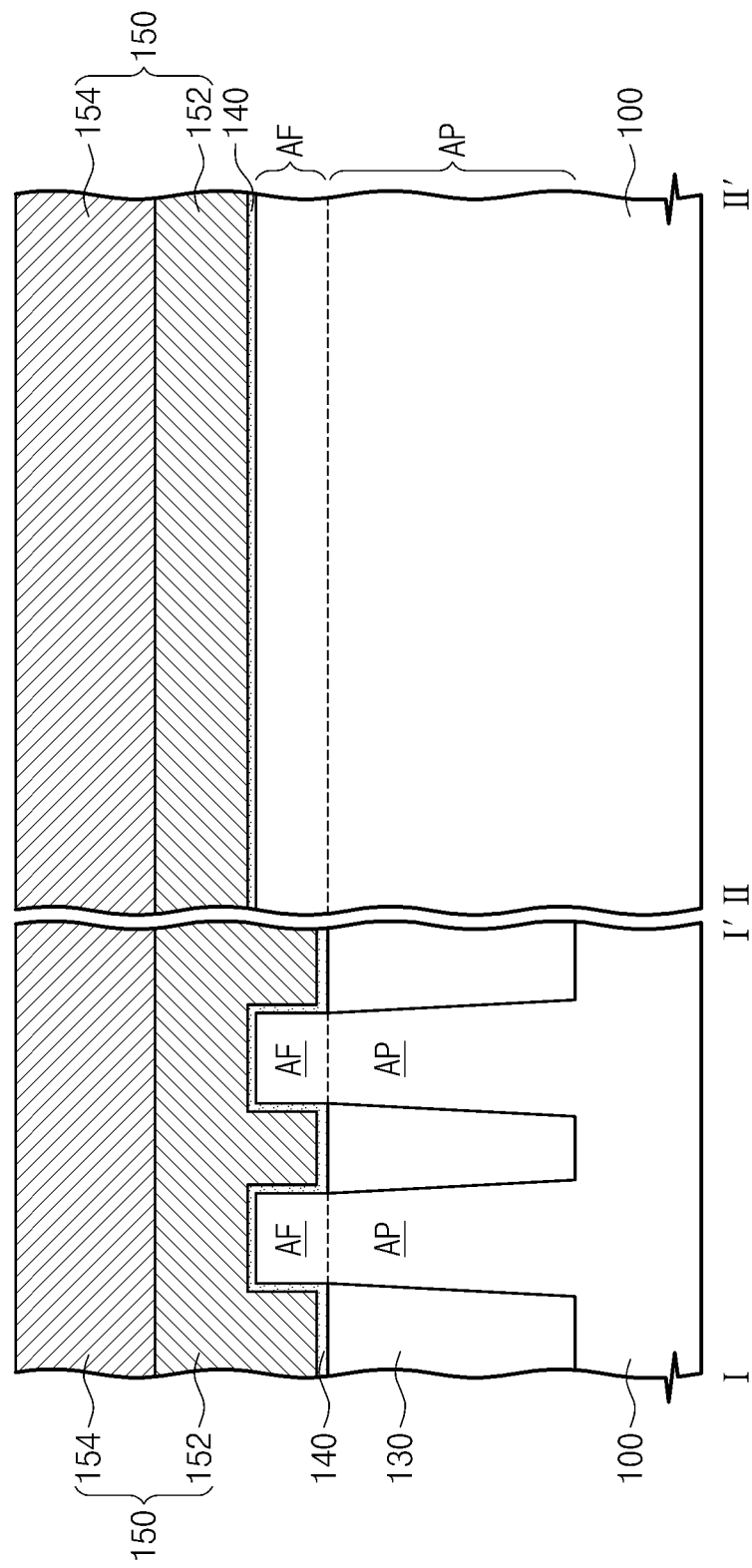

Referring to FIGS. 1, 5A, and 5B, a gate dielectric layer 140 is formed to cover the active fins AF (S20), and a sacrificial gate layer 150 is then formed on the gate dielectric layer 140. The gate dielectric layer 140 may include at least one of high-k dielectric layers. For example, the gate dielectric layer 140 may be formed of at least one of, but not limited to, a hafnium oxide layer, a hafnium silicate layer, a zirconium oxide layer, or a zirconium silicate layer. In some embodiments, the formation process of the gate dielectric layer 140 may include depositing a high-k dielectric layer and thermally treating the deposited high-k dielectric layer. The high-k dielectric layer may be deposited by, for example, an atomic layer deposition technique.

The sacrificial gate layer 150 may include at least one layer having an etch selectivity with respect to the gate dielectric layer 140. In some embodiments, the sacrificial gate layer 150 may include a first sacrificial layer 152 and a second sacrificial layer 154 which are sequentially stacked on the gate dielectric layer 140. The first sacrificial layer 152 may include at least one of materials having an etch selectivity with respect to the gate dielectric layer 140, and the second sacrificial layer 154 may include at least one of materials having an etch selectivity with respect to the first sacrificial layer 152. Since the second sacrificial layer 154 has the an etch selectivity with respect to the first sacrificial layer 152, the second sacrificial layer 154 may be used as a hard mask during a patterning process which will be described with reference to FIGS. 6A and 6B. In some embodiments, the first sacrificial layer 152 may be formed of silicon, and the second sacrificial layer 154 may be formed of silicon nitride.

Figure 6A:
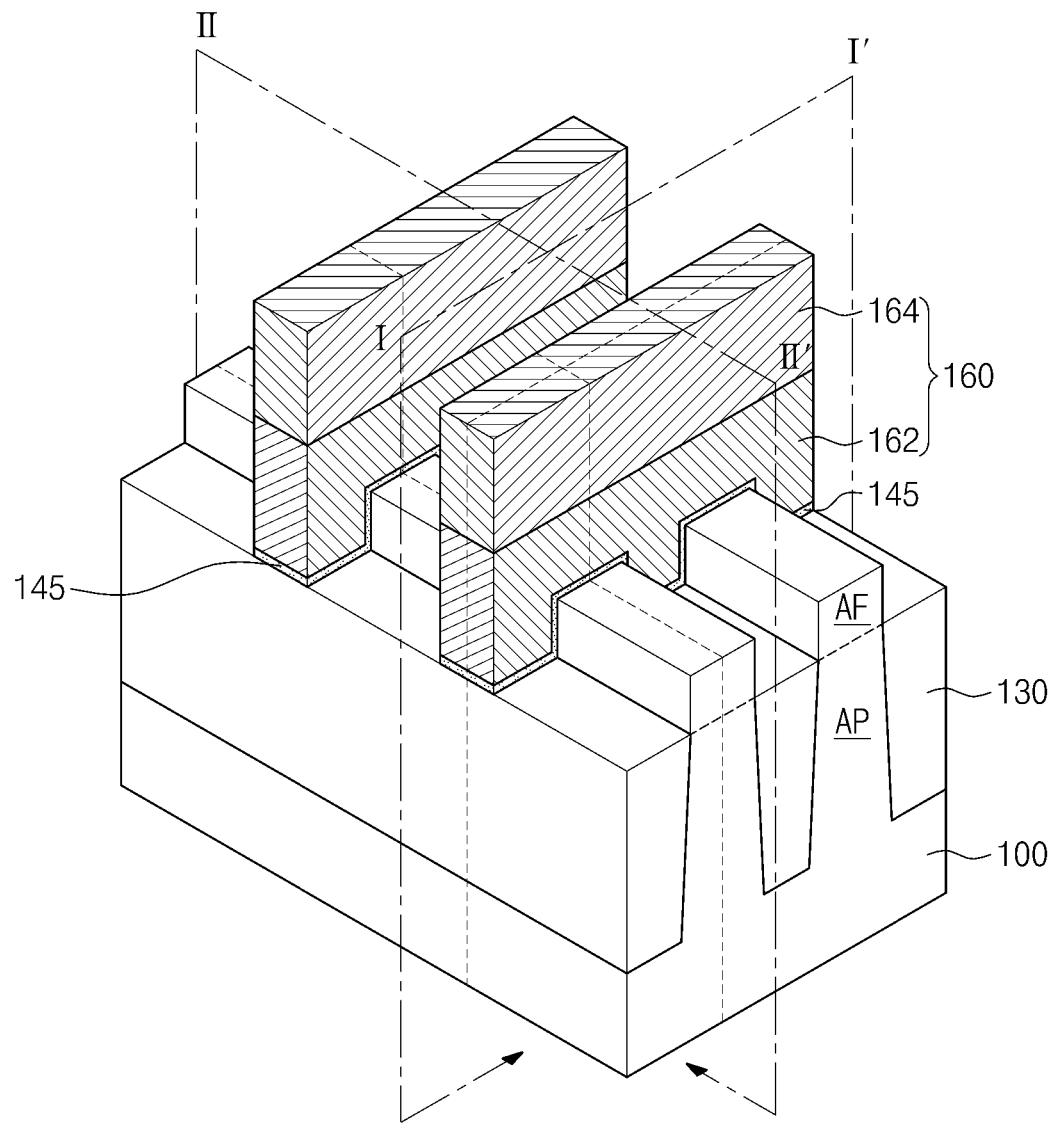
Figure 6B:
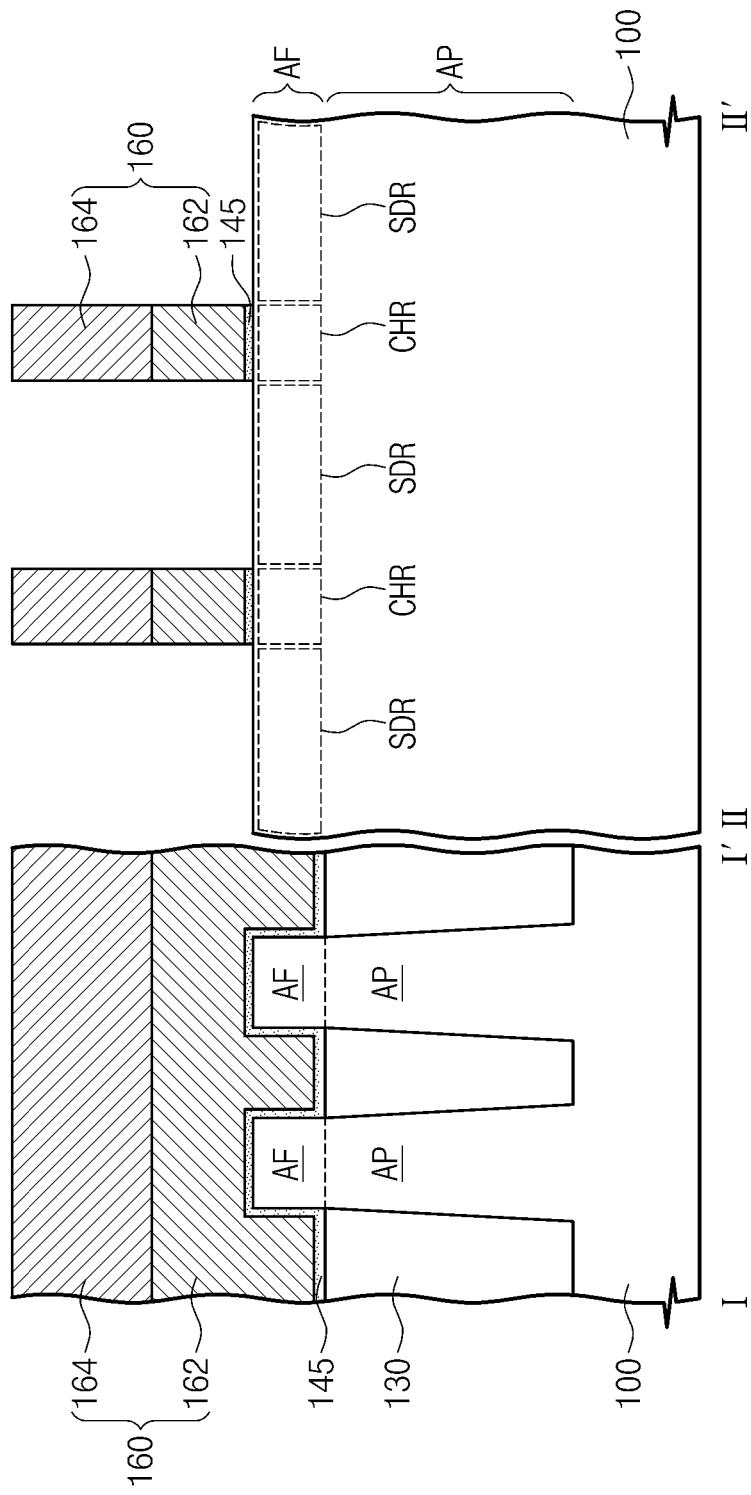

Referring to FIGS. 1, 6A, and 6B, the sacrificial gate layer 150 is patterned to form a sacrificial gate pattern 160 including first and second sacrificial patterns 162 and 164 (S30).

The sacrificial gate pattern 160 may be formed to intersect the active fins AF. Thus, a channel region CHR and source/drain regions SDR may be defined in each of the active fins AF, as illustrated in FIG. 6B. The channel region CHR may be a portion of the active fin AF disposed under the sacrificial gate pattern 160. The source/drain regions SDR may be other portions of the active fin AF that are disposed at both sides of the sacrificial gate pattern 160 and are horizontally separated from each other by the channel region CHR.

The formation process of the sacrificial gate pattern 160 may be performed to expose portions (e.g., the source/drain regions SDR) of the active fin AF disposed at both sides of the sacrificial gate pattern 160. For example, the formation process of the sacrificial gate pattern 160 may include anisotropically etching the sacrificial gate layer 150 using the gate dielectric layer 140 as an etch stop layer and etching the gate dielectric layer 140 to expose the source/drain regions SDR. In some embodiments, the gate dielectric layer 140 may be etched using an isotropic etching technique, and thus, a gate dielectric pattern 145 may be locally formed under the sacrificial gate pattern 160.

Figure 7A:
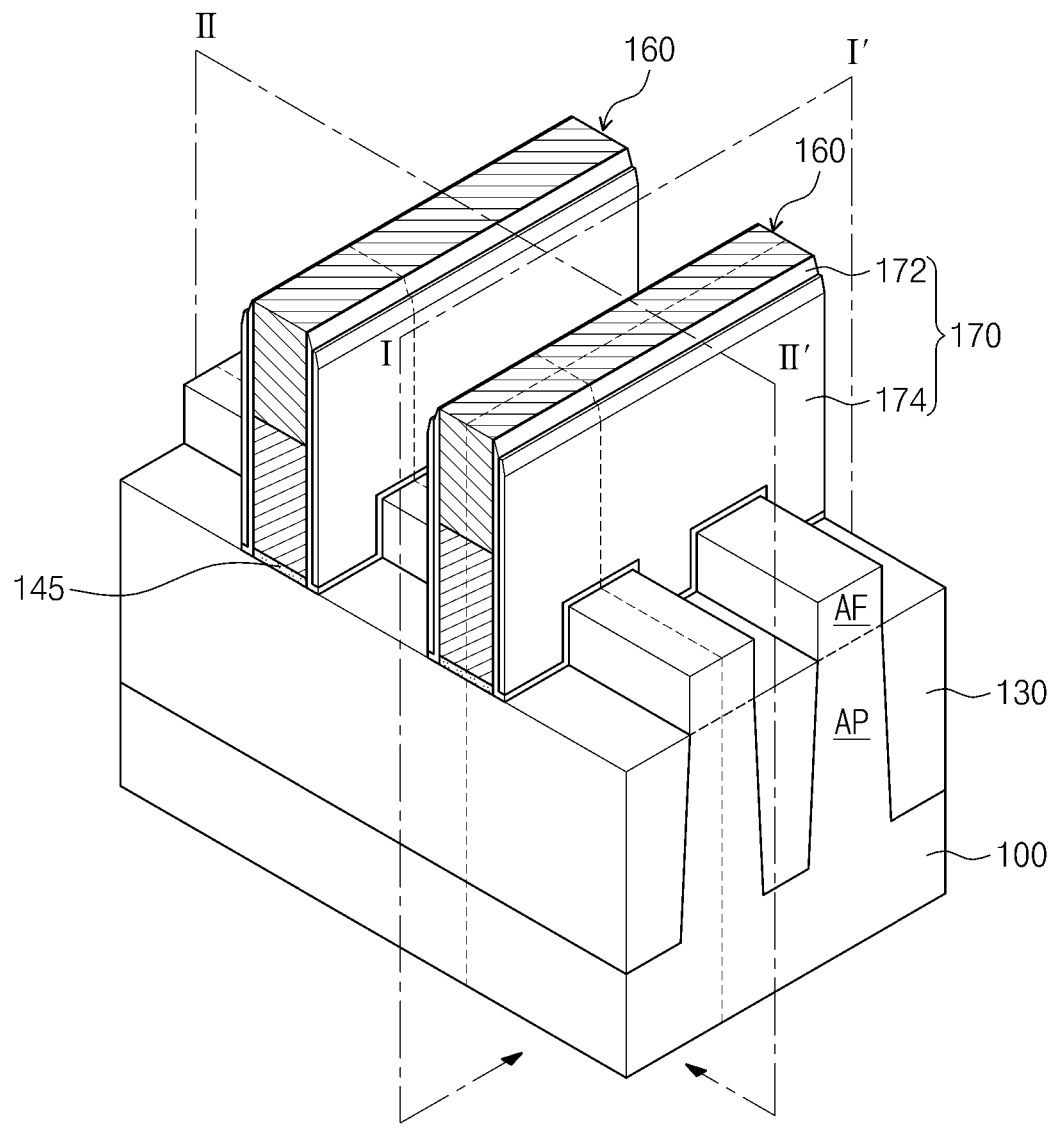
Figure 7B:
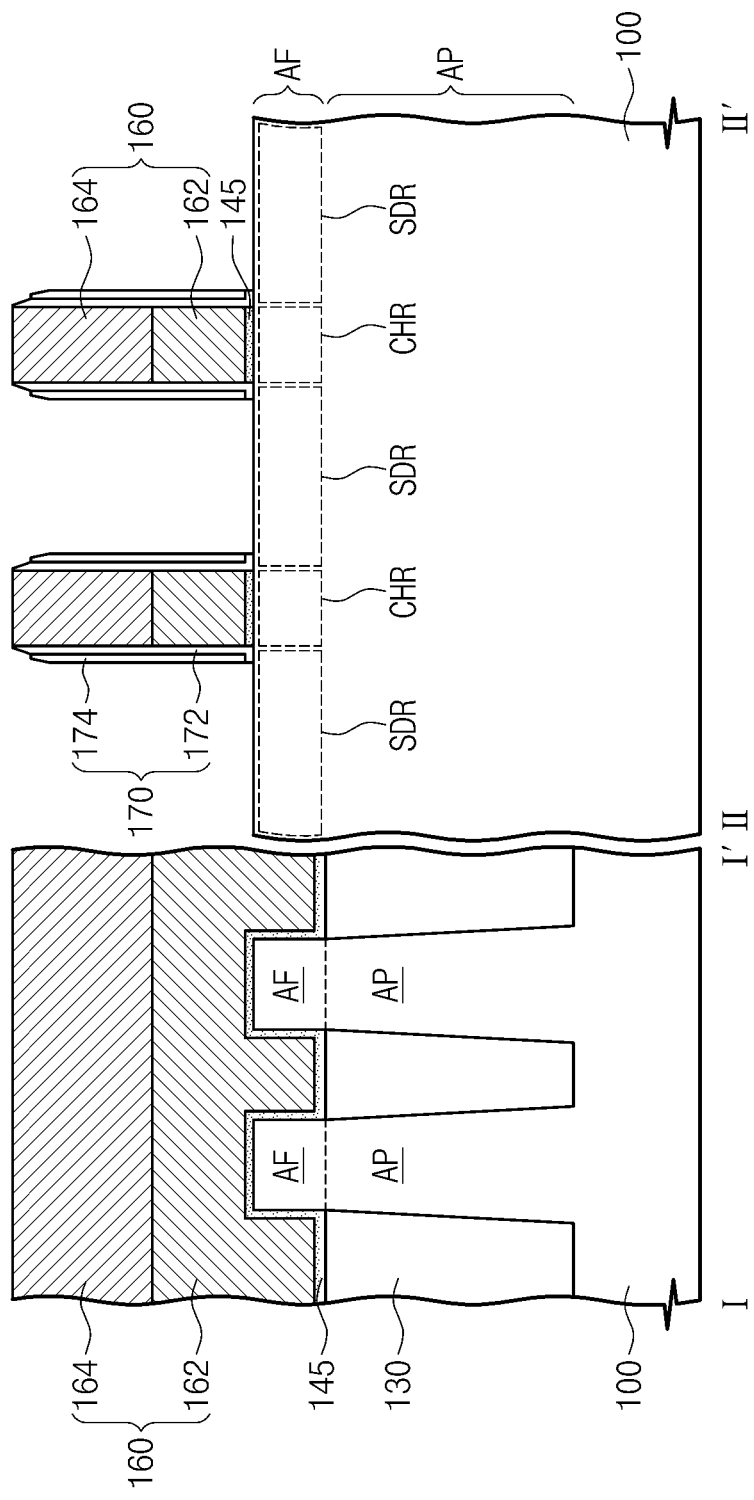

Referring to FIGS. 1, 7A, and 7B, gate spacers 170 are formed on both sidewalls (e.g., opposite first and second sidewalls) of the sacrificial gate pattern 160 (S40). Each of the gate spacers 170 may include a first gate spacer 172 and a second gate spacer 174 which sequentially cover each sidewall of the sacrificial gate pattern 160.

In some embodiments, first and second gate spacer layers may be sequentially formed on the resultant structure including the sacrificial gate pattern 160, and the second and first gate spacer layers may be etched until the active fin AF is exposed, thereby forming the gate spacers 170. The gate spacers 170 may be formed to expose the source/drain regions SDR of the active fin AF. In addition, the gate spacers 170 may be formed to expose a top surface of the sacrificial gate pattern 160. For example, a top surface of the second sacrificial pattern 164 may be exposed between the gate spacers 170.

The second gate spacer 174 may include at least one low-k dielectric layer, and the first gate spacer 172 may include at least one insulating material having an etch selectivity with respect to the second gate spacer 174. For example, the first gate spacer 172 may be formed of a silicon oxide-based material or a silicon nitride-based material, and the second gate spacer 174 may be formed of a silicon oxycarbonitride (SiOCN)-based material.

Figure 8A:
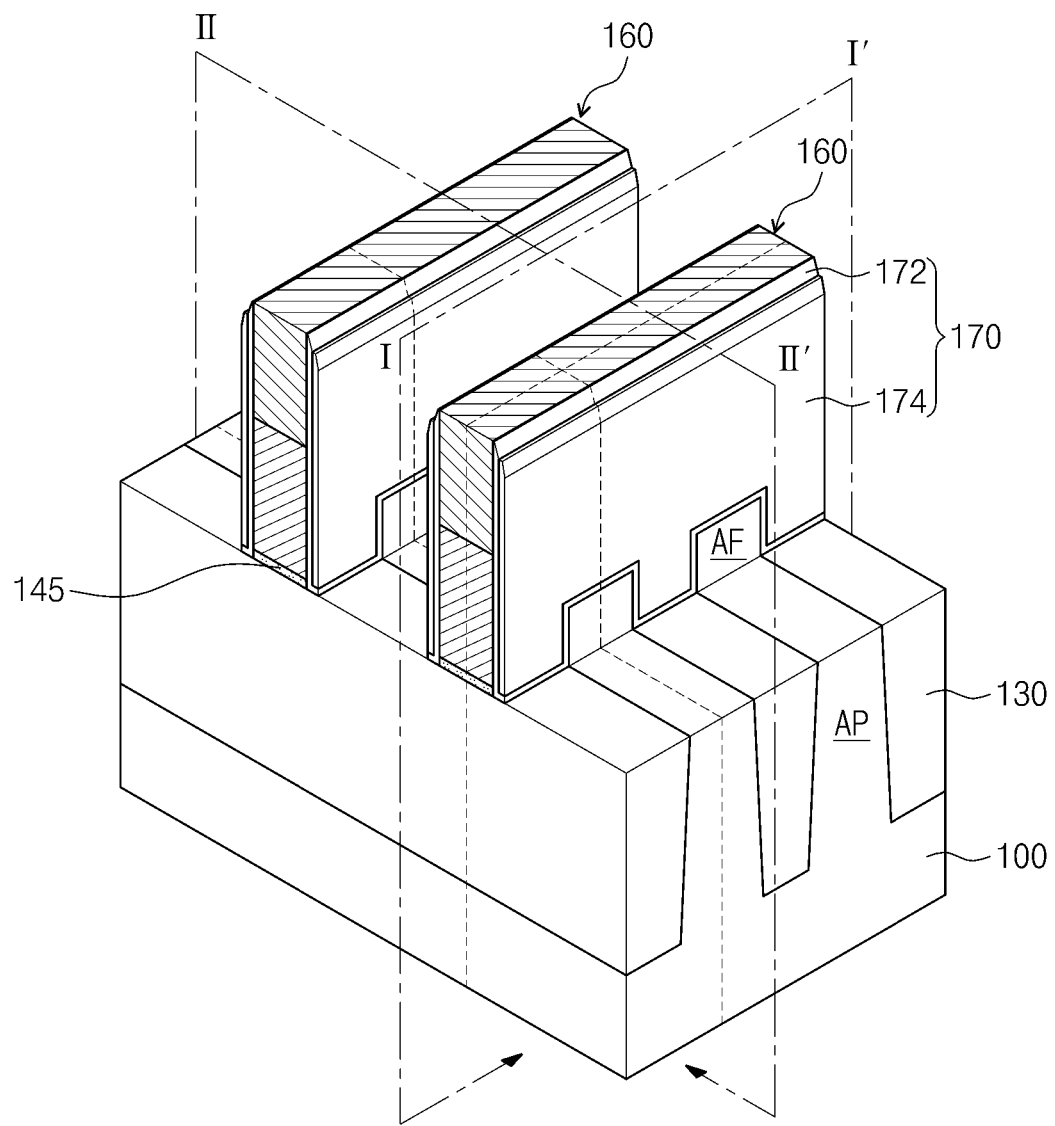
Figure 8B:
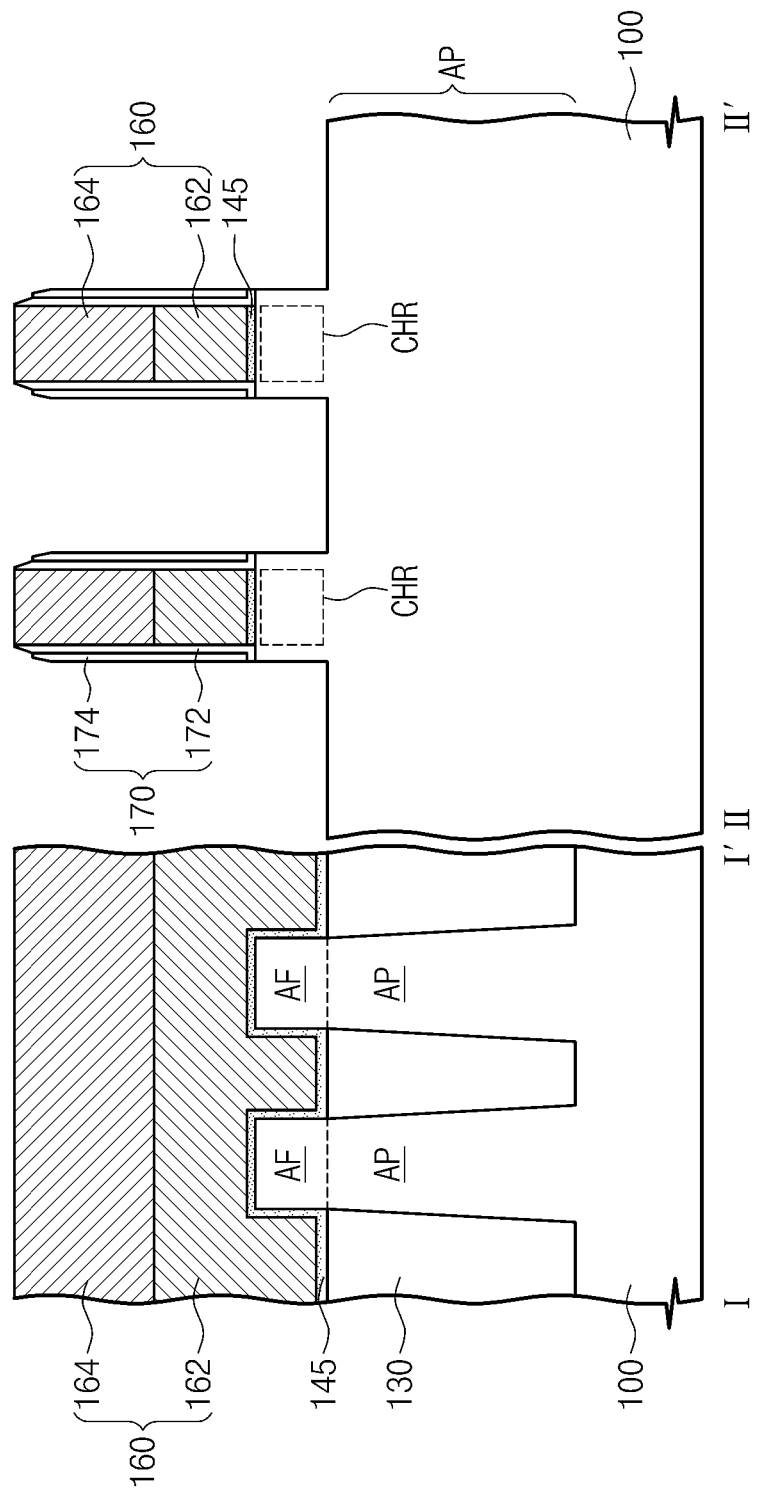

Referring to FIGS. 1, 8A and 8B, the source/drain regions SDR are recessed using the sacrificial gate patterns 160 and the gate spacers 170 as an etch mask (S42). In some embodiments, the source/drain regions SDR may be recessed by the etching process for the formation of the gate spacers 170. Alternatively, the source/drain regions SDR may be recessed by a subsequent process performed immediately after the etching process for the formation of the gate spacers 170.

Figure 9A:
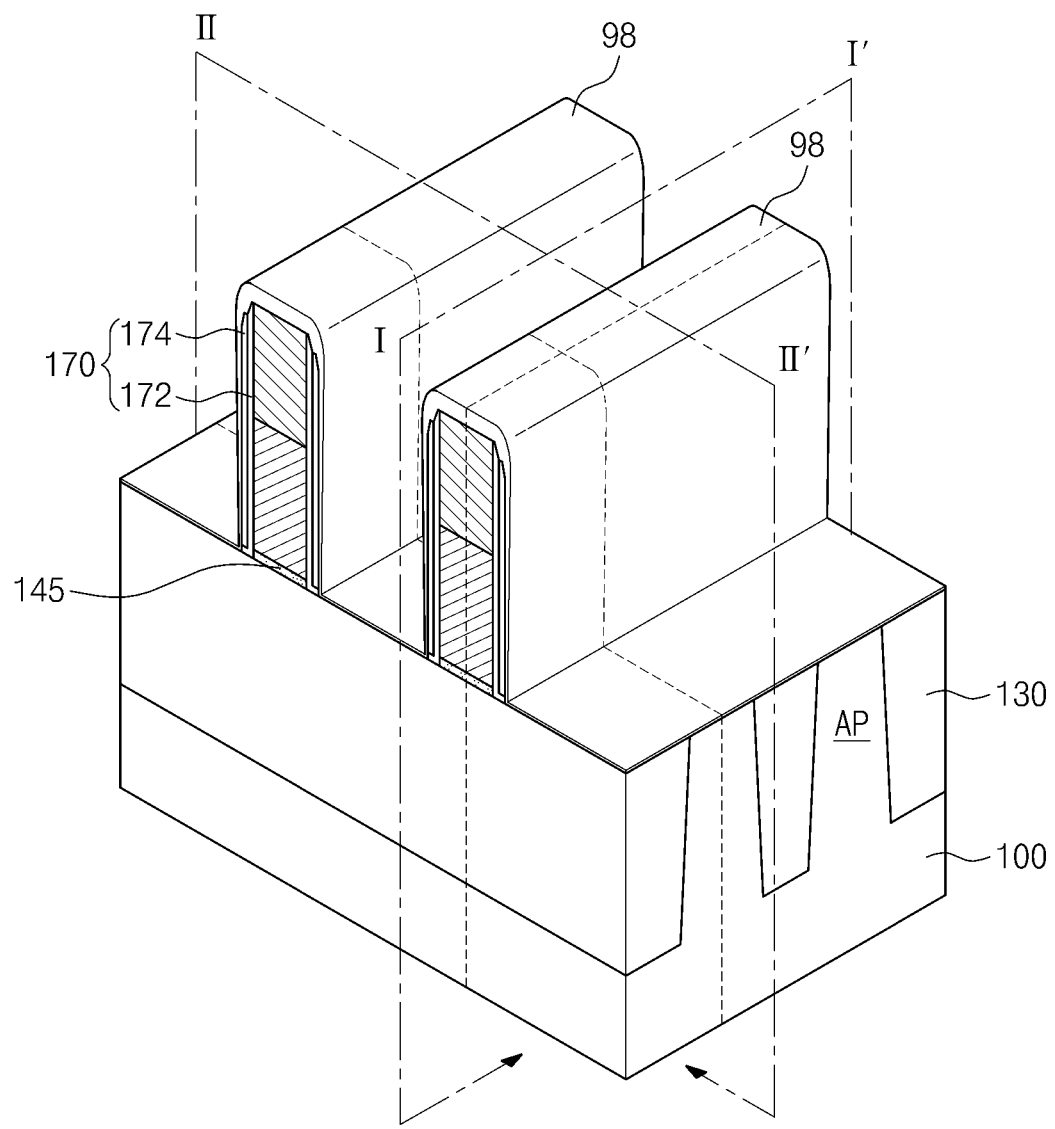
Figure 9B:
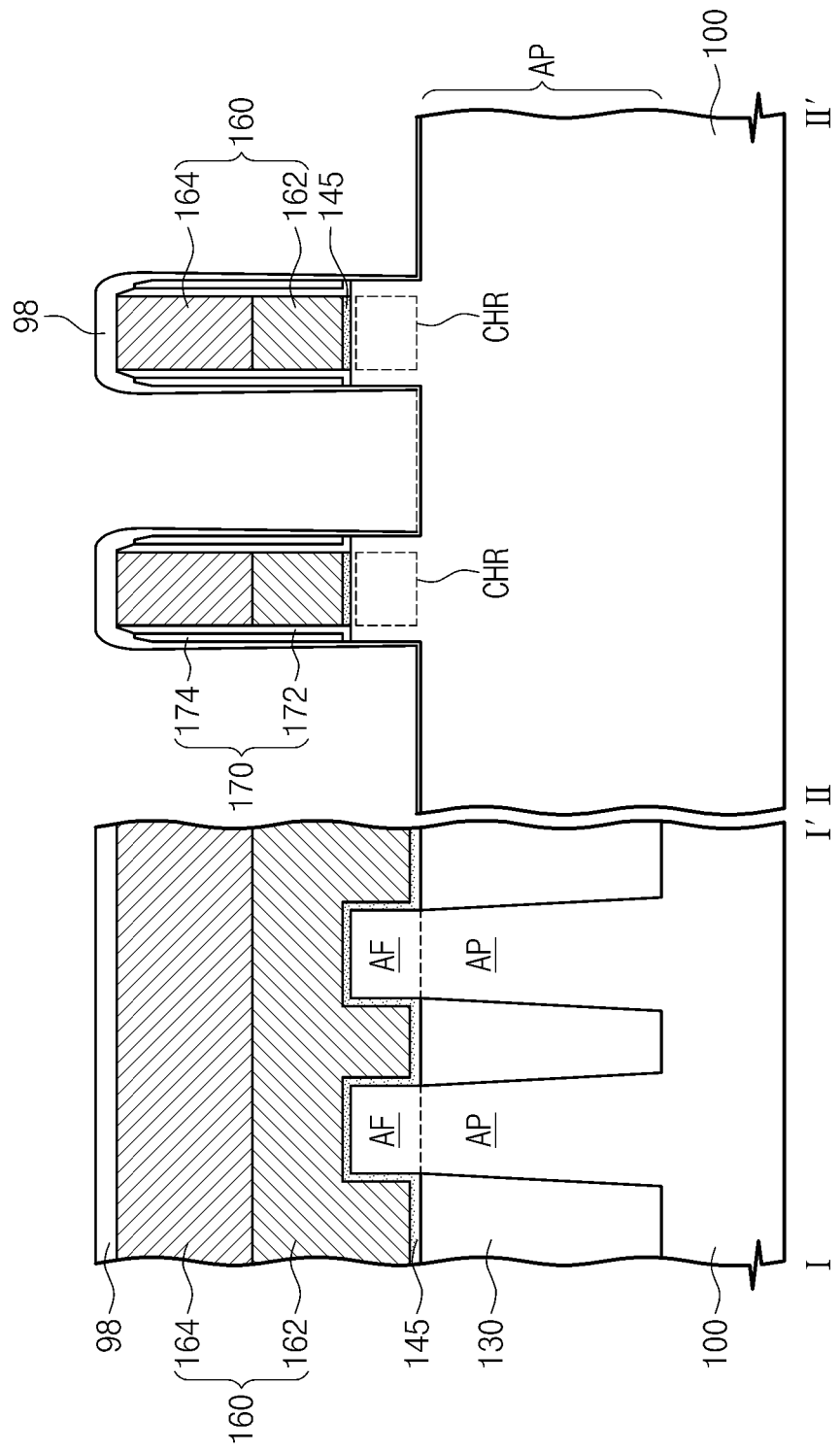

Referring to FIGS. 9A, and 9B, a preliminary growth-inhibiting layer 98 is formed. The preliminary growth-inhibiting layer 98 may be formed to have a thickness that progressively increases as a vertical distance from the substrate 100 increases. For example, the preliminary growth-inhibiting layer 98 disposed on the active pattern AP may be thinner than the preliminary growth-inhibiting layer 98 disposed on the sacrificial gate pattern 160. In some embodiments, the thickness of the preliminary growth-inhibiting layer 98 disposed on the sacrificial gate pattern 160 may be in a range of about 40 Å to about 200 Å.

In addition, the preliminary growth-inhibiting layer 98 may include a material capable of inhibiting growth of an epitaxial layer during a subsequent epitaxial process. For example, the preliminary growth-inhibiting layer 98 may include a silicon oxide-based material such as silicon oxynitride (SION) In other examples, the preliminary growth-inhibiting layer 98 may include a silicon oxycarbonitride (SiOCN)-based material. Since the preliminary growth-inhibiting layer 98 inhibiting the growth of the epitaxial layer has a thickness difference according to a height as described above, it is possible to realize selective growth of the epitaxial which will be described in more detail with reference to FIGS. 11A and 11B.

Figure 14:
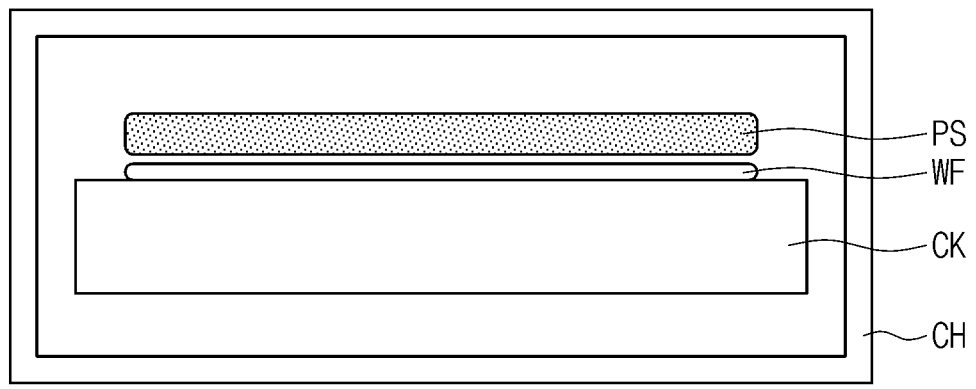
FIG. 14 is a view provided to explain a plasma oxidation process according to some embodiments of the inventive concepts.

In one embodiment, the thickness difference according to the height of the preliminary growth-inhibiting layer 98 may be realized through a plasma oxidation process which oxidizes the resultant structure including the gate spacers 170 under plasma environment. The plasma oxidation process may be performed using a chamber CH configured to generate plasma PS, as illustrated in FIG. 14. For example, the recessing process of the source/drain regions SDR is performed on a wafer WF. In the plasma oxidation process, the wafer WF may be loaded on a chuck CK and oxygen-containing plasma PS may be then generated on the wafer WF. Under the plasma environment, oxygen atoms may react with silicon atoms included in the second sacrificial pattern 164 or the gate spacers 170 to form the silicon oxide-based material or the silicon oxycarbonitride (SiOCN)-based material.

A general oxidation process may be performed at a pressure of several mTorr to tens mTorr. In this case, ions may have a long mean free path. On the other hand, the plasma oxidation process may be performed at a high pressure in a range of 1 Torr to 30 Torr. Ions may have a reduced mean free path during the plasma oxidation process by the high pressure. Thus, the ions may easily reach the top surface of the sacrificial gate pattern 160 but may reach the top surface of the active pattern AP with difficulty. As a result, the preliminary growth-inhibiting layer 98 may be formed to be thicker on the sacrificial gate pattern 160 than on the active pattern AP.

In addition, the plasma oxidation process may be performed without applying a back-bias to the chuck CK. The applying of the back-bias may increase a vertical component (i.e., a component vertical to a top surface of the chuck CK) of movement of the ions. However, according to some embodiments, the back-bias may not be applied to the chuck CK, so the ions may easily reach the top surface of the sacrificial gate pattern 160 but may reach the top surface of the active pattern AP with difficulty. As a result, the preliminary growth-inhibiting layer 98 may be formed to be thinner on the active pattern AP than on the sacrificial gate pattern 160.

Figure 10A:
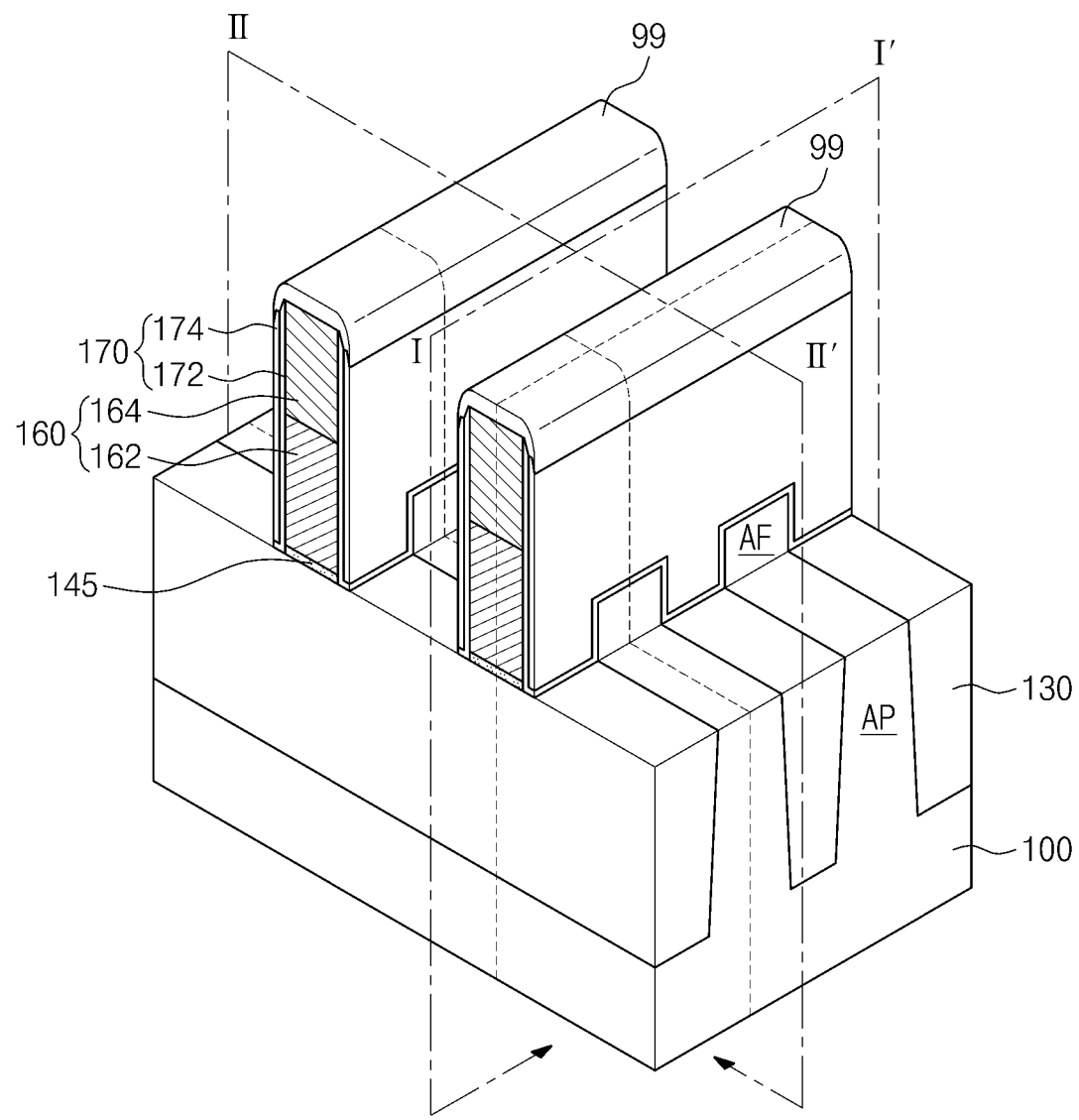

Referring to FIGS. 1, 10A, and 10B, a growth-inhibiting layer 99 is formed (S45). In some embodiments, a cleaning or etching process may be performed to etch the preliminary growth-inhibiting layer 98 to form growth-inhibiting layer 99. The preliminary growth-inhibiting layer 98 may be etched using an isotropic etching technique (e.g., a wet etching technique using hydrofluoric acid) to expose the active pattern AP. After the isotropic etching process, the preliminary growth-inhibiting layer 98 on the active pattern AP may be removed but the preliminary growth-inhibiting layer 98 on the second sacrificial pattern 164 may remain due to the aforementioned thickness difference of the preliminary growth-inhibiting layer 98. For example, the growth-inhibiting layer 99 may locally remain on the top surface of the second sacrificial pattern 164. In some embodiments, a portion of the growth-inhibiting layer 99 may cover surfaces of upper portions of the gate spacers 170.

Figure 11A:
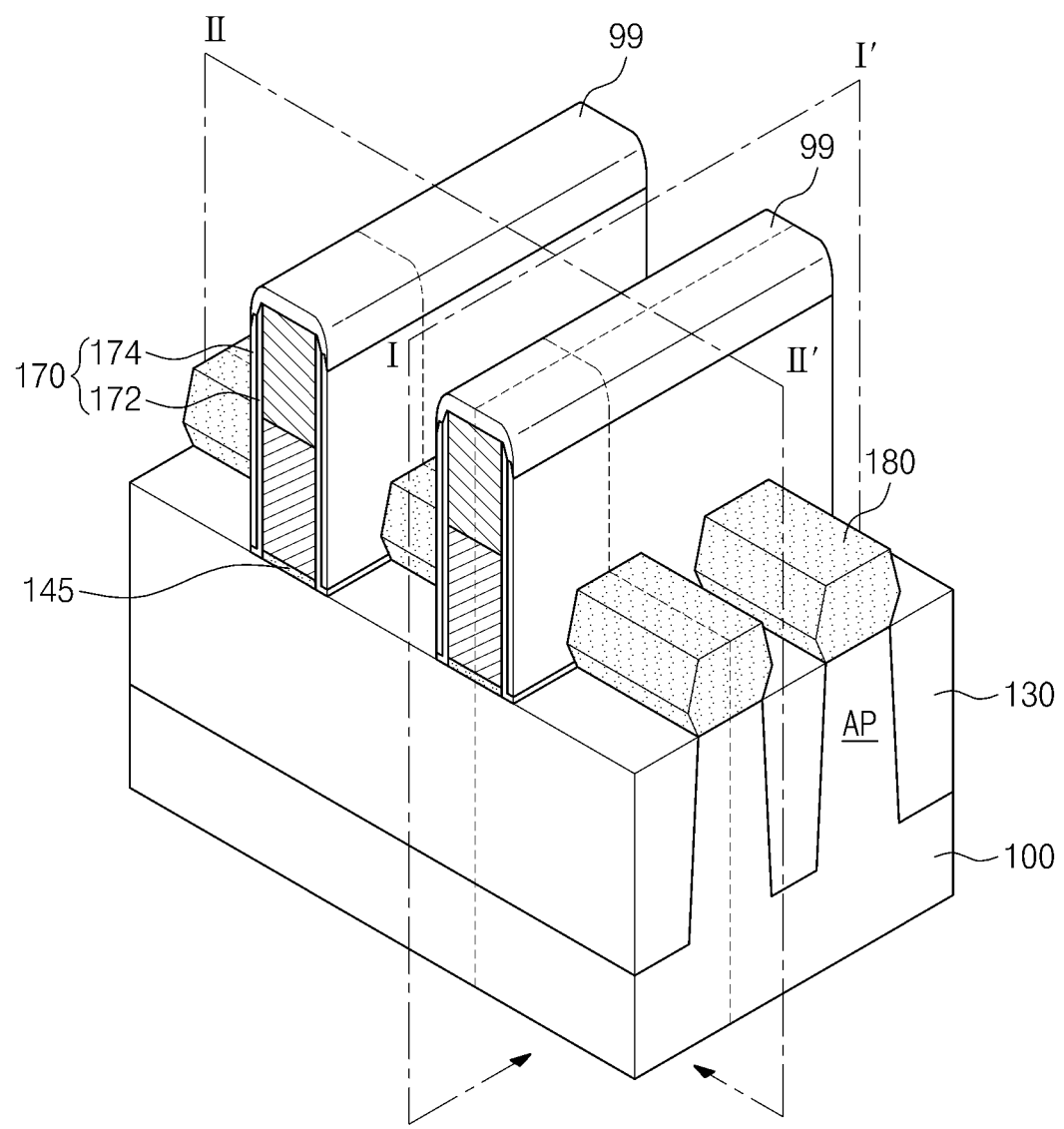
Figure 11B:
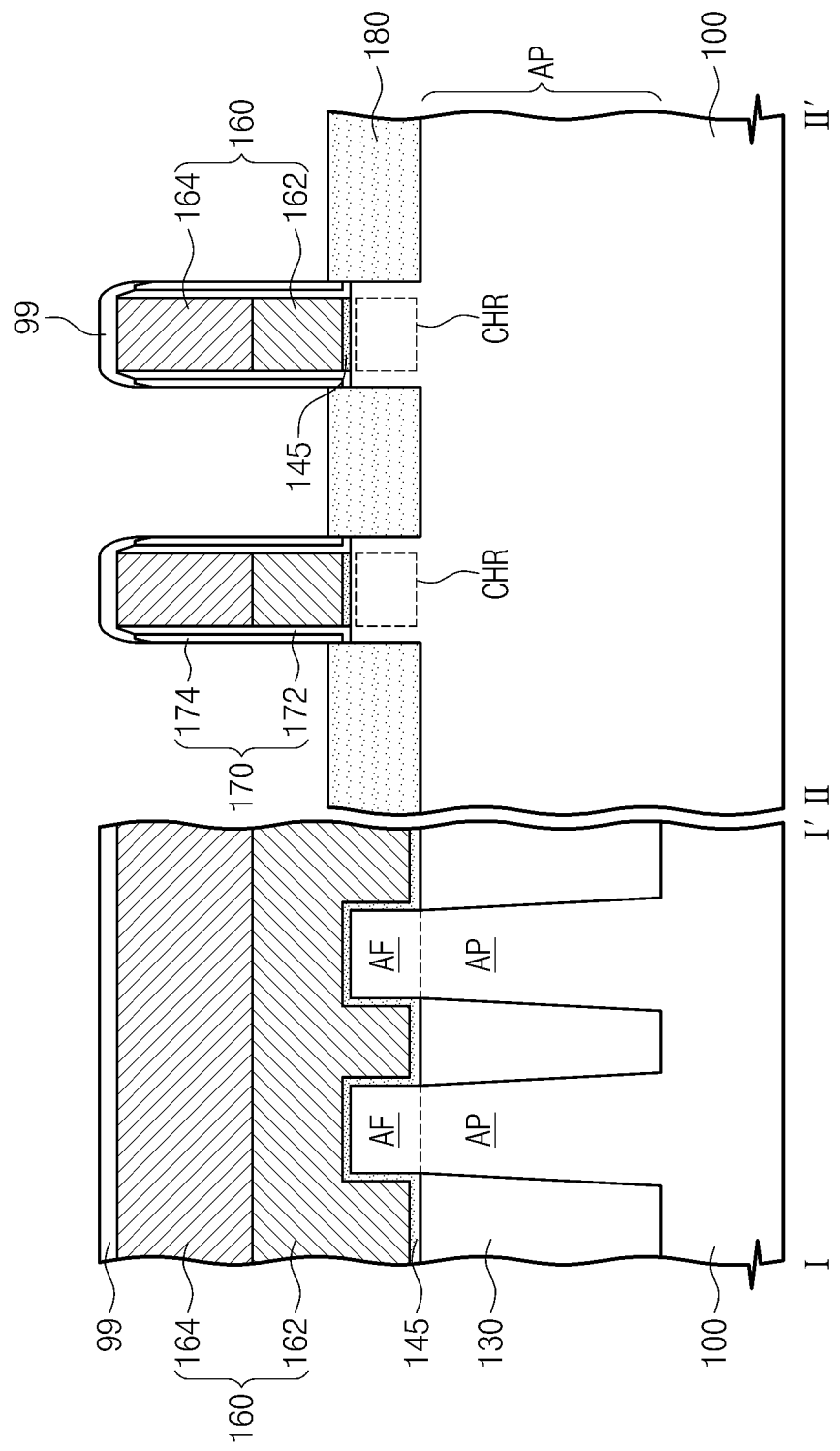

Referring to FIGS. 1, 11A, and 11B, source/drain electrodes 180 are formed at both sides (e.g., opposite first and second sides) of the sacrificial gate pattern 160 (S50). The source/drain electrodes 180 may be formed at positions of the source/drain regions SDR of the active fin AF. Thus, the channel region CHR of the active fin AF may be disposed between the source/drain electrodes 180.

The formation process of the source/drain electrodes 180 may include growing an epitaxial layer from exposed surfaces of the active pattern AP by a selective epitaxial growth technique. In some embodiments, the epitaxial layer may be formed of a material capable of providing compressive strain to the channel region CHR. For example, the epitaxial layer may be formed of silicon-germanium (SiGe). Meanwhile, the epitaxial layer may be selectively grown from the exposed surface of the active fin AF. This is because a growth rate of the silicon-germanium (SiGe) on silicon oxide is far less than that of the silicon-germanium (SiGe) on silicon or silicon nitride and the growth-inhibiting layer 99 covers the second sacrificial pattern 164 and/or the first gate spacer 172 which include the silicon nitride-based material. In other words, the epitaxial layer of the silicon-germanium (SiGe) may be locally formed on the exposed surfaces of the active fin AF.

In some embodiments, the formation process of the epitaxial layer may include forming a first epitaxial layer for a source/drain electrode of an NMOS field effect transistor and forming a second epitaxial layer for a source/drain electrode of a PMOS field effect transistor. The first epitaxial layer may be formed of a material capable of providing tensile strain to a channel region of the NMOS field effect transistor, and the second epitaxial layer may be formed of a material capable of providing compressive strain to a channel region of the PMOS field effect transistor. For example, the first epitaxial layer may be formed of silicon carbide (SiC), and the second epitaxial layer may be formed of silicon-germanium (SiGe). However, the inventive concepts are not limited thereto.

Figure 12A:
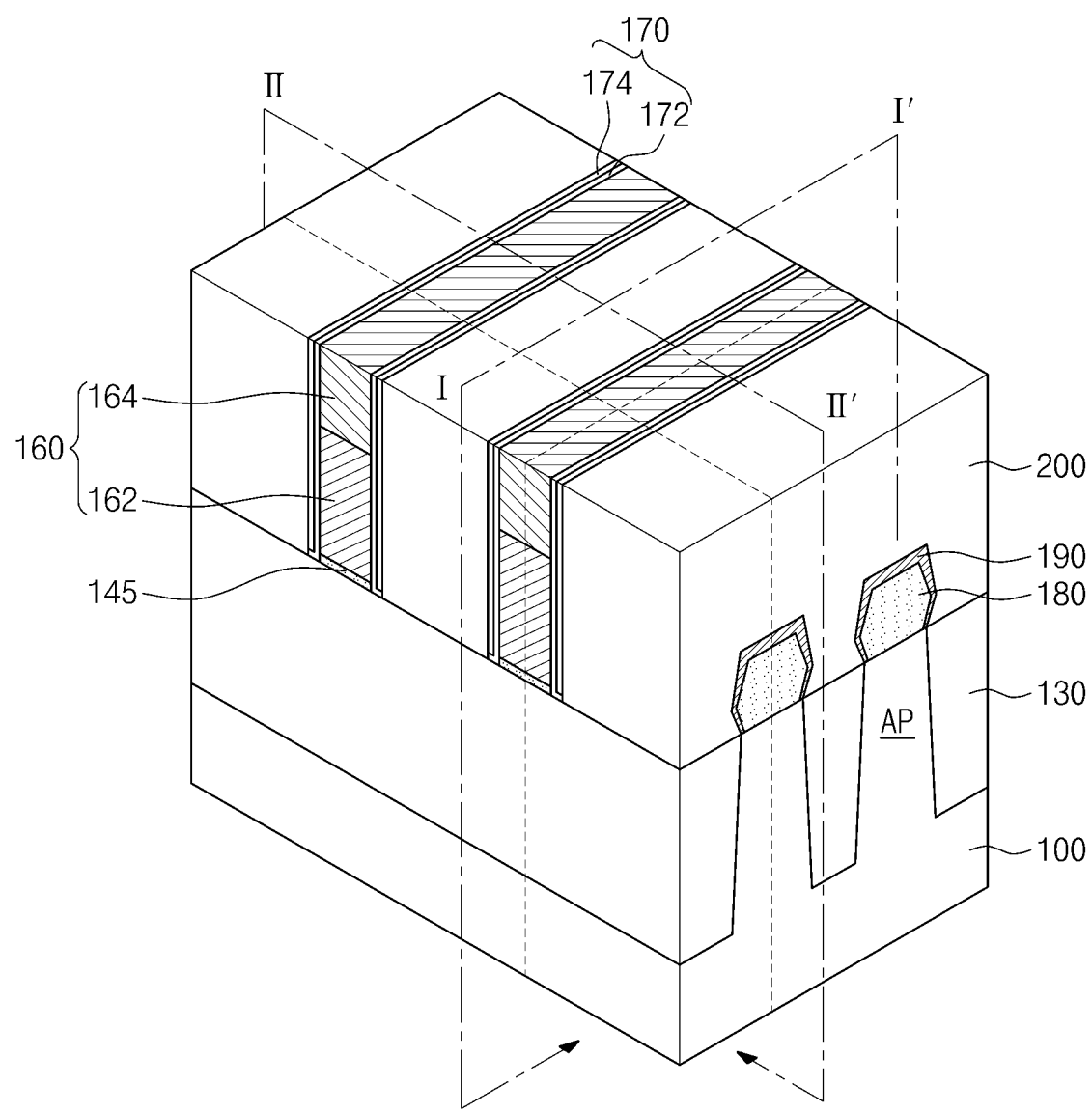
Figure 12B:
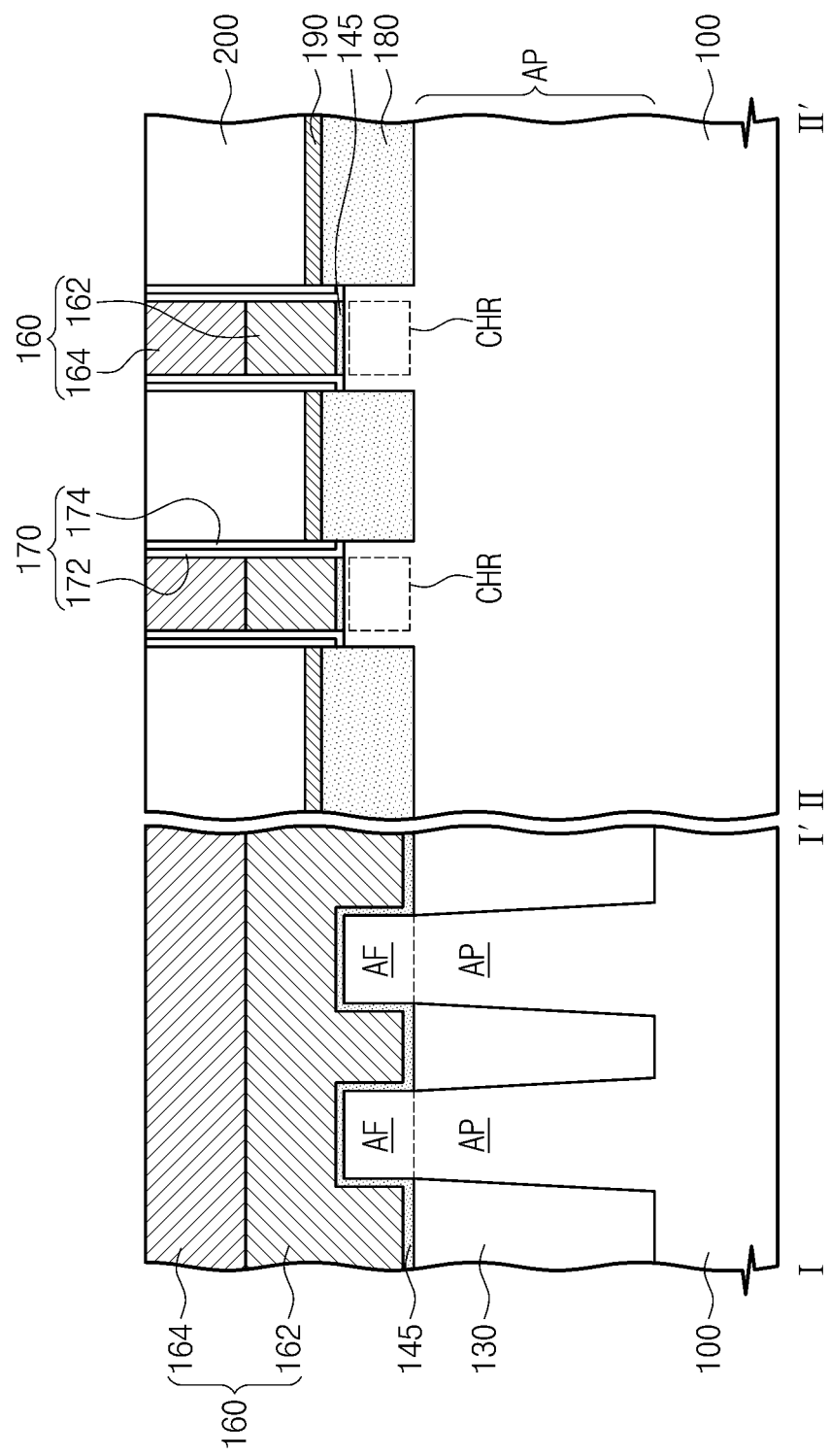

Referring to FIGS. 1, 12A, and 12B, silicide patterns 190 may be formed to cover exposed surfaces of the source/drain electrodes 180 (S60), and a lower interlayer insulating layer 200 is formed on the substrate 100 having the silicide patterns 190.

The silicide patterns 190 may be formed using a self-aligned silicidation process. For example, the formation process of the silicide patterns 190 may include forming a metal layer on the resultant structure having the source/drain electrodes 180, reacting the metal layer with the source/drain electrodes 180, and removing an unreacted metal layer. The silicide patterns 190 may include nickel silicide, cobalt silicide, tungsten silicide, titanium silicide, niobium silicide, or tantalum silicide.

The formation process of the lower interlayer insulating layer 200 may include forming an insulating layer on the resultant structure including the silicide patterns 190 and etching the insulating layer to expose the top surface of the sacrificial gate pattern 160. The lower interlayer insulating layer 200 may include at least one of a silicon oxide layer, a silicon nitride layer, a silicon oxynitride layer, or low-k dielectric layers.

Figure 13A:
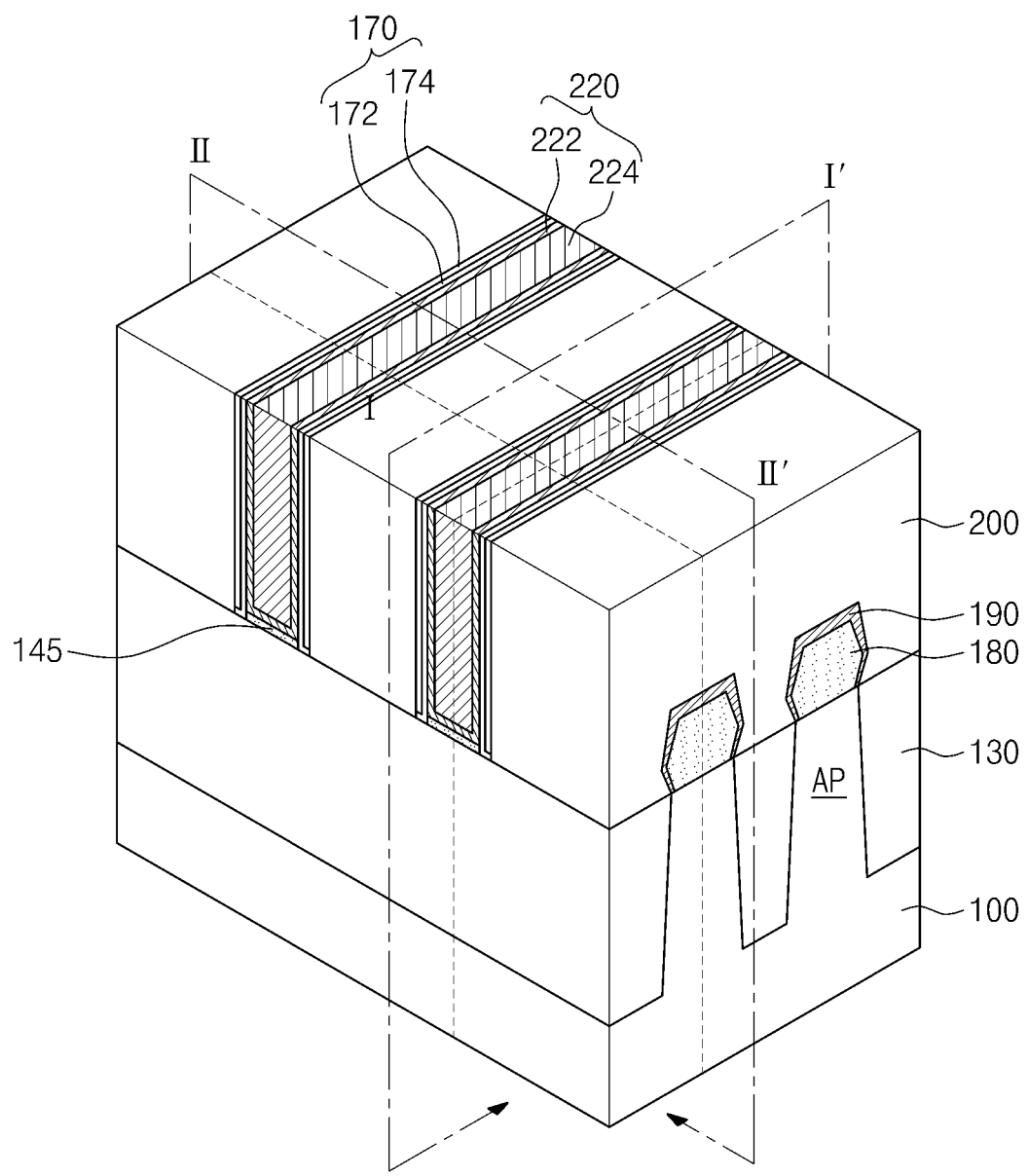
Figure 13B:
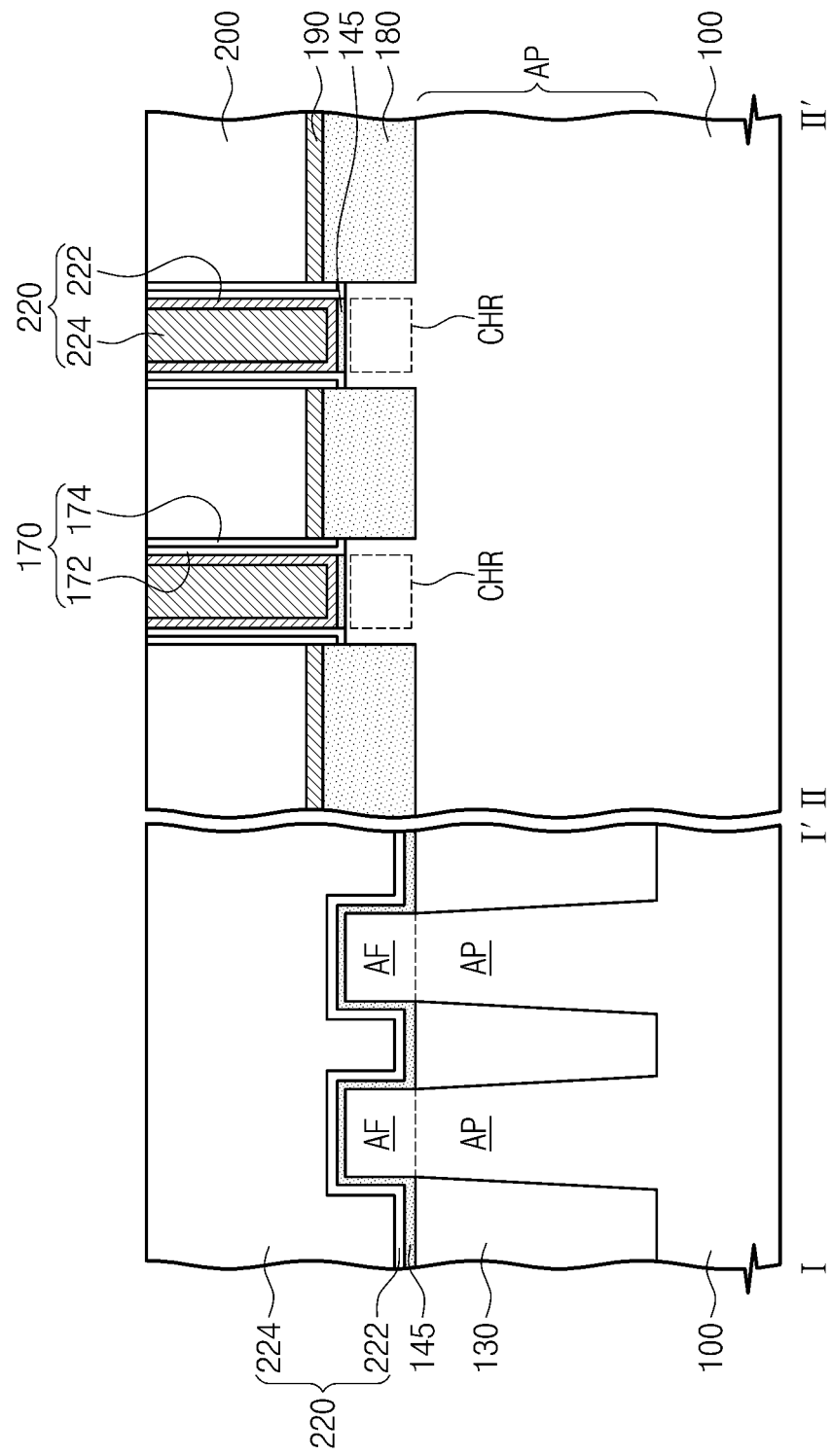

Referring to FIGS. 1, 13A, and 13B, the sacrificial gate pattern 160 may be removed to form a gap region expose the gate dielectric pattern 145 between the gate spacers 170, and a gate electrode 220 may be formed to fill the gap region (S70).

The second and first sacrificial patterns 164 and 162 may be sequentially etched using an etch recipe having an etch selectivity with respect to the gate spacers 170, the lower interlayer insulating layer 200, and the gate dielectric pattern 145, and thus, the gap region may be formed.

The gate electrode 220 may be formed to directly cover a top surface of the gate dielectric pattern 145 and may include a first gate electrode 222 and a second gate electrode 224 which are sequentially stacked on the gate dielectric pattern 145. The first gate electrode 222 may be formed of a conductive material having a predetermined work function to control a threshold voltage of the channel region CHR. In some embodiments, the first gate electrode 222 may be formed of at least one material, such as a metal nitride. For example, the first gate electrode 222 may be formed of titanium nitride or tantalum nitride. The second gate electrode 224 may be formed of at least one conductive material having resistivity lower than that of the first gate electrode 222. In some embodiments, the second gate electrode 224 may be formed of at least one metal (e.g., aluminum and tungsten).

If the semiconductor device includes a complementary metal-oxide-semiconductor (CMOS) structure, the formation process of the gate electrode 220 may include forming a gate electrode of an NMOS field effect transistor and forming a gate electrode of a PMOS field effect transistor. The gate electrode of the PMOS field effect transistor may be formed independently of the gate electrode of the NMOS field effect transistor. However, the inventive concepts are not limited to the above embodiment of forming the gate electrodes of the NMOS and PMOS field effect transistors independently of each other.

In some embodiments, the gate dielectric pattern 145 may be removed during the formation of the gap region, and a new gate dielectric layer may be formed before the formation of the gate electrode 220. In this case, the new gate dielectric layer may include at least one of high-k dielectric layers (e.g., a hafnium oxide layer, a hafnium silicate layer, a zirconium oxide layer, and a zirconium silicate layer). In addition, the new gate dielectric layer may be formed to have a U-shaped cross section.

Thereafter, an interconnection structure is formed to be connected to the source/drain electrodes 180 through the silicide patterns 190 (S80). In some embodiments, an upper interlayer insulating layer may be formed to cover the resultant structure having the gate electrode 220, and contact holes exposing the silicide patterns 190 may be formed to penetrate the upper interlayer insulating layer and the lower interlayer insulating layer 200. Subsequently, contact plugs may be formed to fill the contact holes, and interconnections connected to the contact plugs may be formed on the upper interlayer insulating layer.

According to some embodiments, the sacrificial gate pattern 160 may be used as a gate electrode of a field effect transistor. In this case, the removal process of the sacrificial gate pattern 160 and the formation process of the gate electrode 220 may be omitted, and the first sacrificial pattern 162 may be formed to include at least one conductive material.

Figure 15:
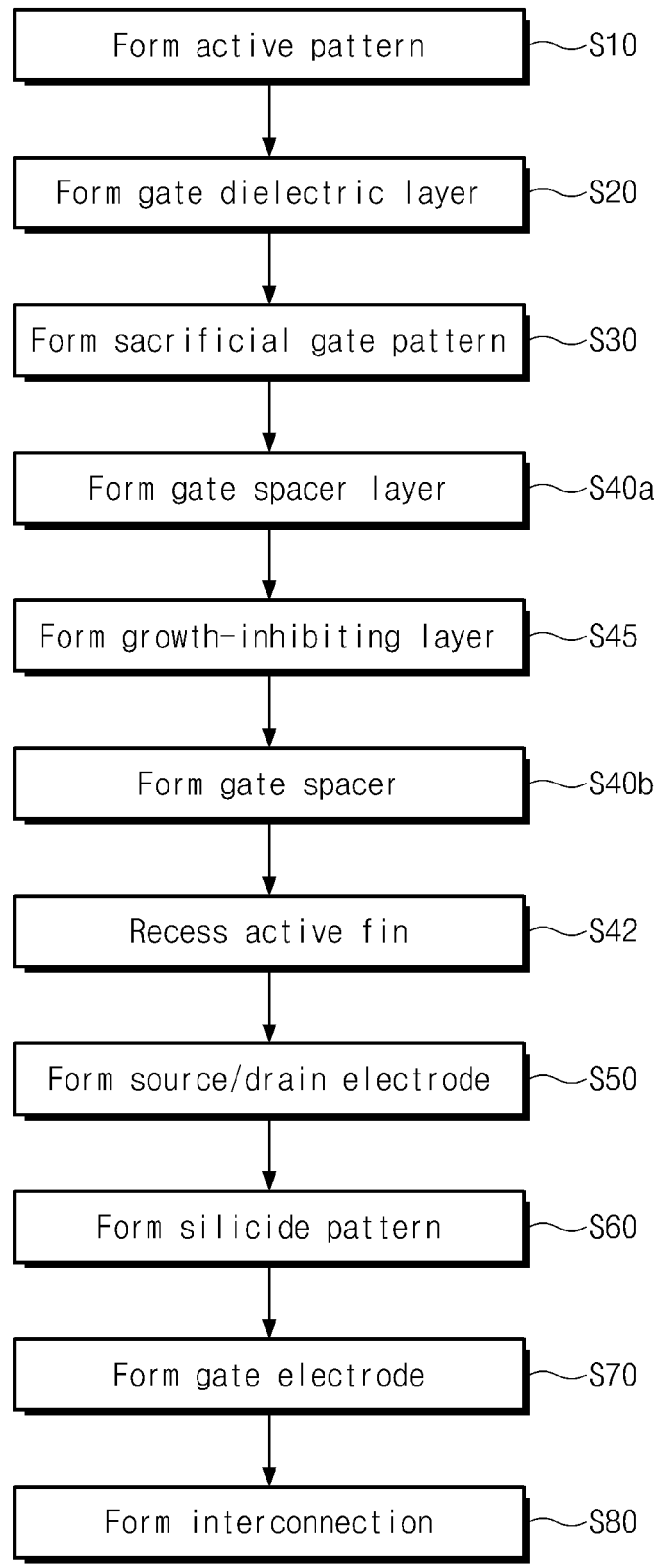
FIG. 15 is a flowchart illustrating a method of manufacturing a semiconductor device according to other embodiments of the inventive concepts.
Figure 16A:
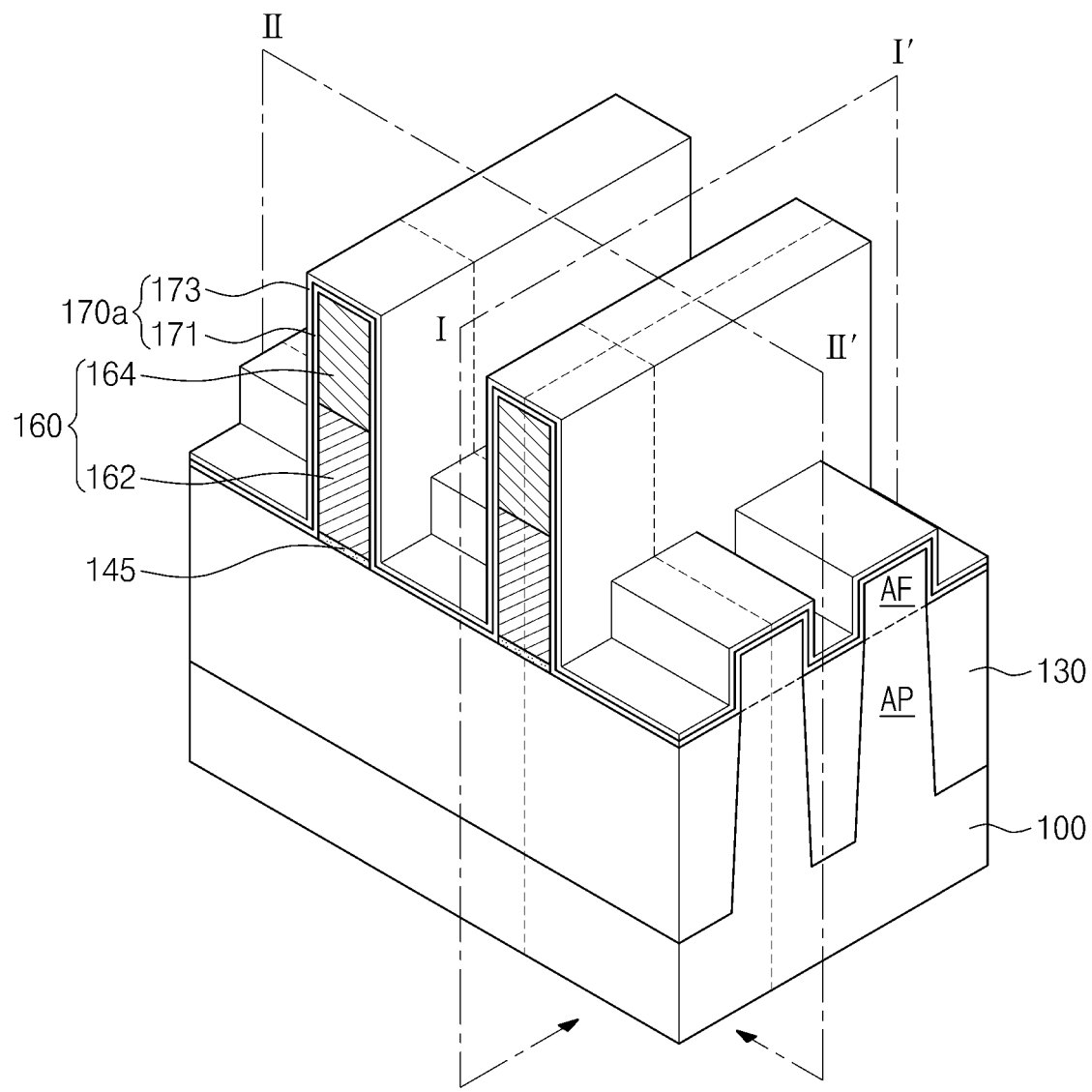
Figure 16B:
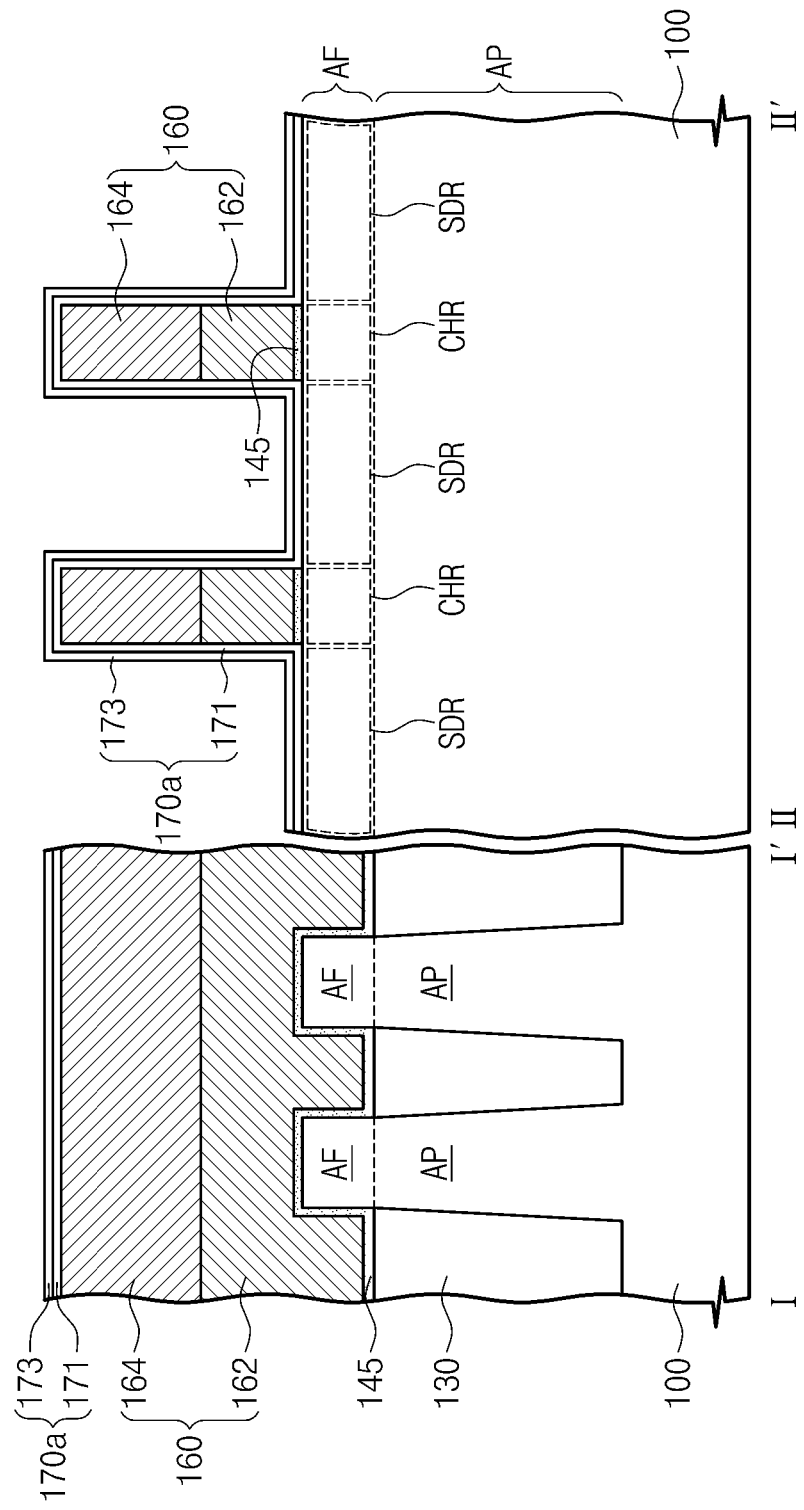
Figure 17A:
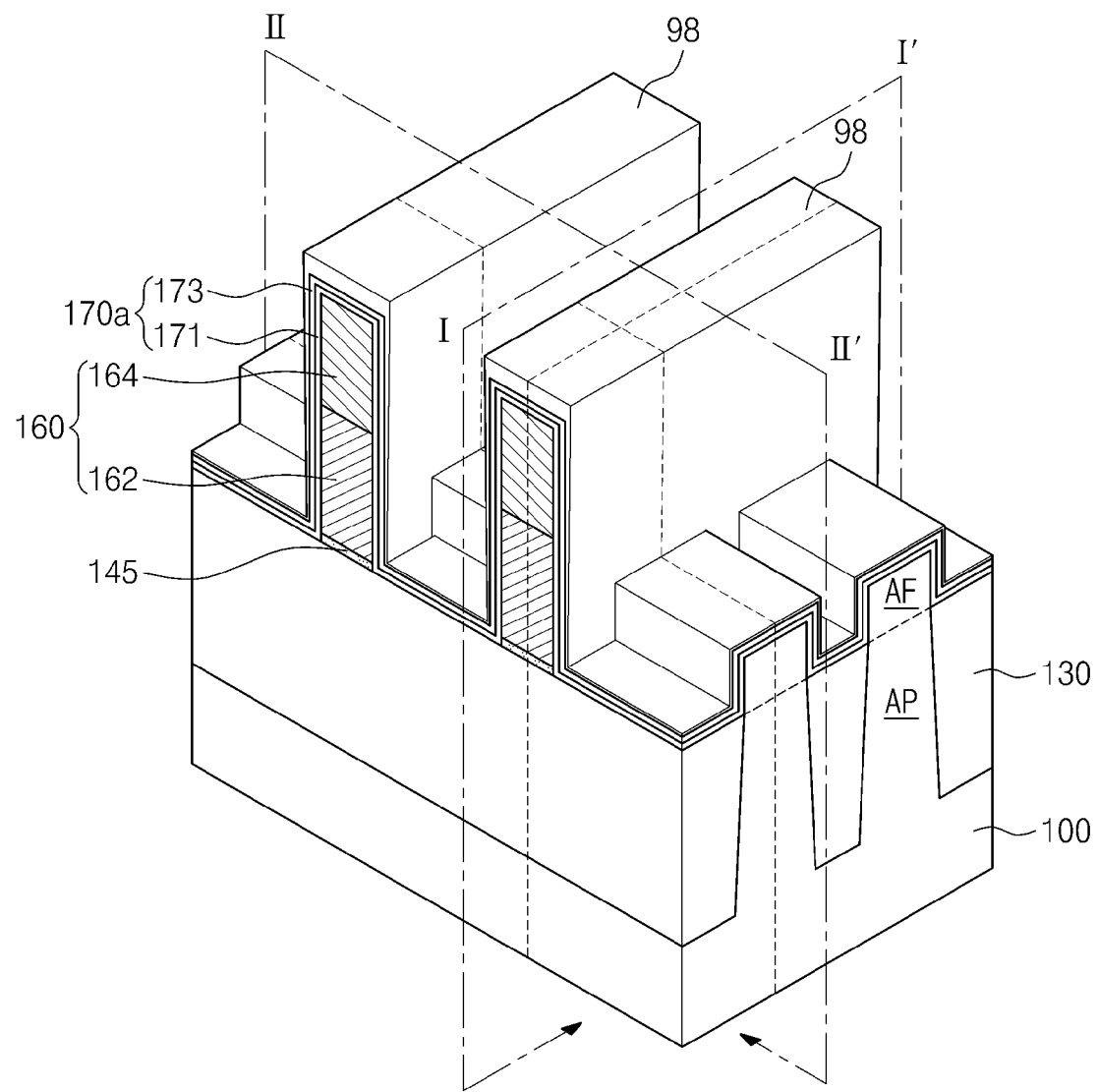

FIG. 15 is a flowchart illustrating a method of manufacturing a semiconductor device according to other embodiments of the inventive concepts. FIGS. 16A to 21A are perspective views illustrating a method of manufacturing a semiconductor device according to other embodiments of the inventive concepts. FIGS. 16B to 21B are cross-sectional views taken along lines I-I' and II-II' of FIGS. 16A to 21A, respectively. In the present embodiment, the same descriptions as mentioned in the aforementioned embodiment will be omitted or described briefly for the purpose of ease and convenience in explanation.

Referring to FIGS. 15, 16A, 16B, 17A, and 17B, a gate spacer layer 170a may be formed to cover the structure having the sacrificial gate pattern 160 (S40a), and the preliminary growth-inhibiting layer 98 may be then formed. The gate spacer layer 170a may include first and second gate spacer layers 171 and 173 that are sequentially deposited on the structure having the sacrificial gate pattern 160. According to the present embodiment, the first gate spacer layer 171 may be formed of a silicon oxide-based material, and the second gate spacers 173 may be formed of a silicon nitride-based material or a silicon oxycarbonitride (SiOCN)-based material. The preliminary growth-inhibiting layer 98 may have substantially the same technical features as described with reference to FIGS. 9A and 9B. For example, the plasma oxidation process may be performed at the chamber pressure of 1 Torr to 30 Torr and/or without applying the back-bias to the chuck to form the preliminary growth-inhibiting layer 98. As a result, the preliminary growth-inhibiting layer 98 may be formed to be thicker on the sacrificial gate pattern 160 than on the active fin AF. In some embodiments, the preliminary growth-inhibiting layer 98 may be formed to have a thickness in a range of about 40 Å to about 200 Å on the sacrificial gate pattern 160. The preliminary growth-inhibiting layer 98 may include a material which is positioned to and is capable of inhibiting growth of an epitaxial layer during a subsequent epitaxial process. For example, the preliminary growth-inhibiting layer 98 may include a silicon oxide-based material or a silicon oxycarbonitride (SiOCN)-based material.

Figure 18A:
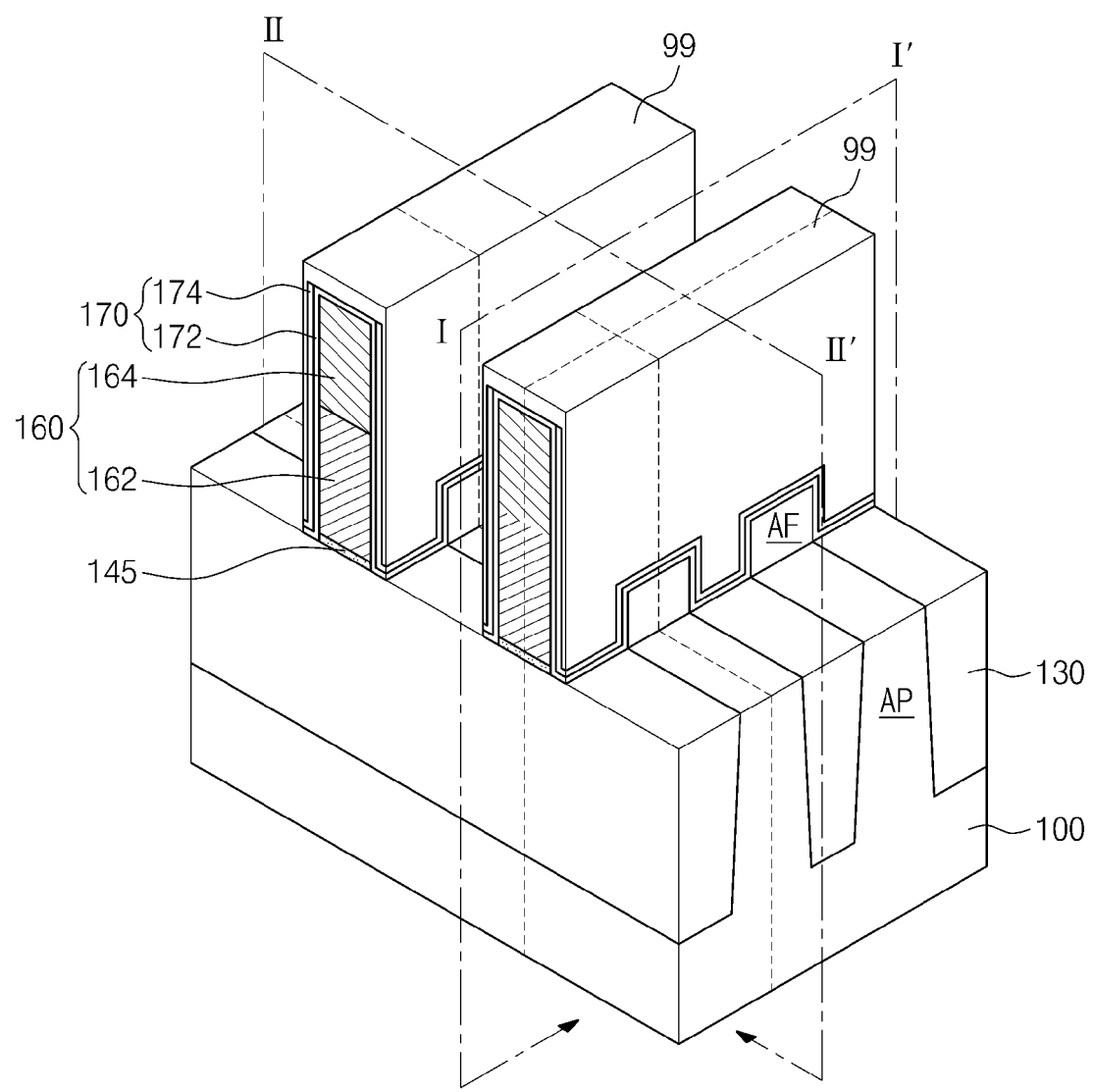
Figure 18B:
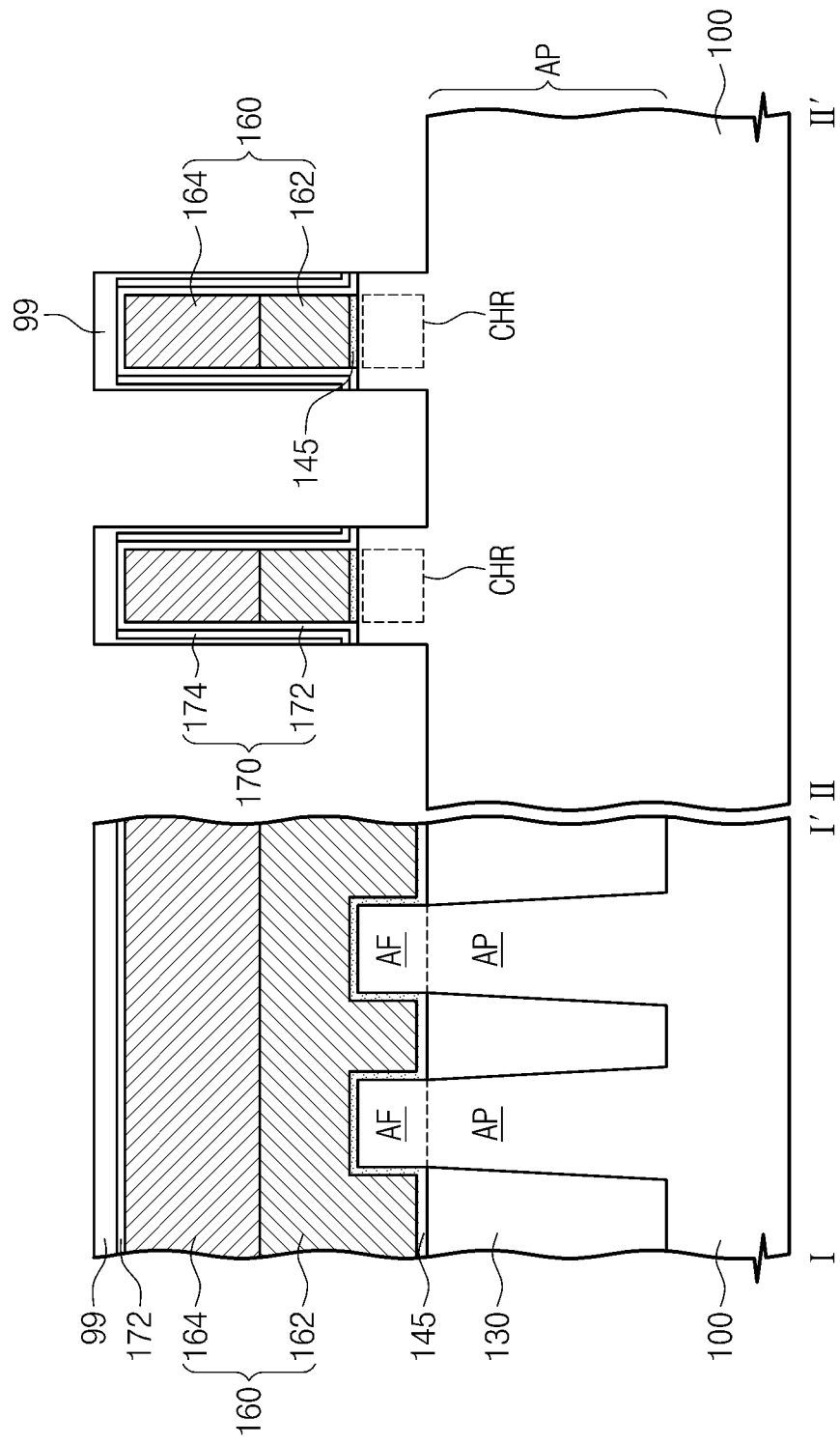

Referring to FIGS. 15, 18A, and 18B, the preliminary growth-inhibiting layer 98 and the second and first gate spacers 173 and 171 are etched to expose the active fin AF. As a result, the growth-inhibiting layer 99 may be formed (S40), and the gate spacers 170 may be formed on both sidewalls of the sacrificial gate pattern 160 (S40b). Each of the gate spacers 170 may include a first gate spacer 172 and a second gate spacer 174 sequentially stacked on the sidewall of the sacrificial gate pattern 160.

Since the growth-inhibiting layer 99 is thicker on the sacrificial gate pattern 160 than on the active fin AF, the growth-inhibiting layer 99 may remain on the sacrificial gate pattern 160 after the formation of the gate spacers 170. In addition, a portion of the growth-inhibiting layer 99 may extend from the top surface of the sacrificial pattern 160 so as to cover an outer sidewall of the second gate spacer 174.

Subsequently, exposed portions (i.e., the source/drain regions SDR) of the active fin AF are recessed (S42). In some embodiments, the source/drain regions SDR may be recessed by the etching process for the formation of the gate spacers 170. Alternatively, the source/drain regions SDR may be recessed by a subsequent process performed immediately after the etching process for the formation of the gate spacers 170.

Figure 19A:
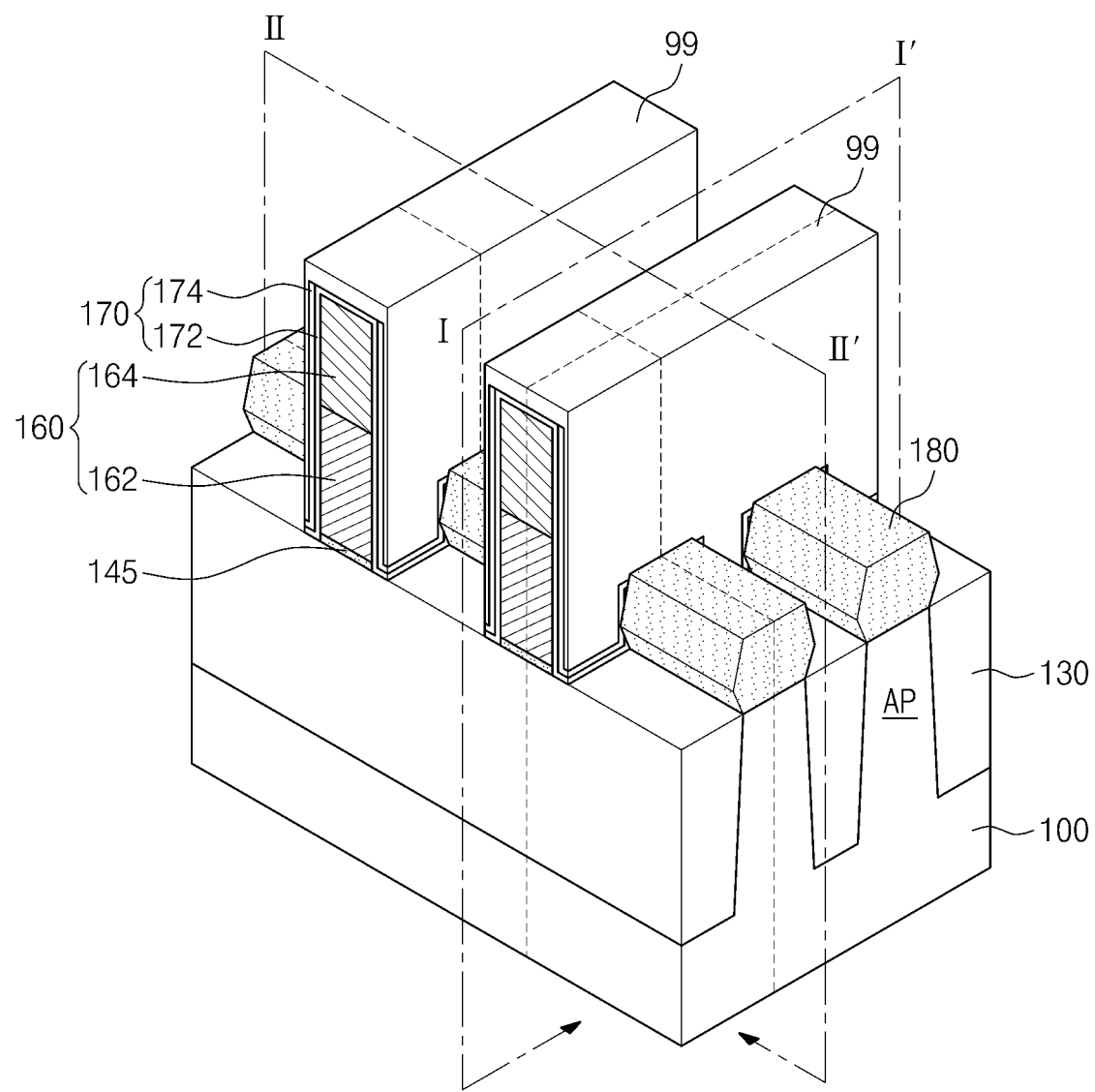
Figure 19B:
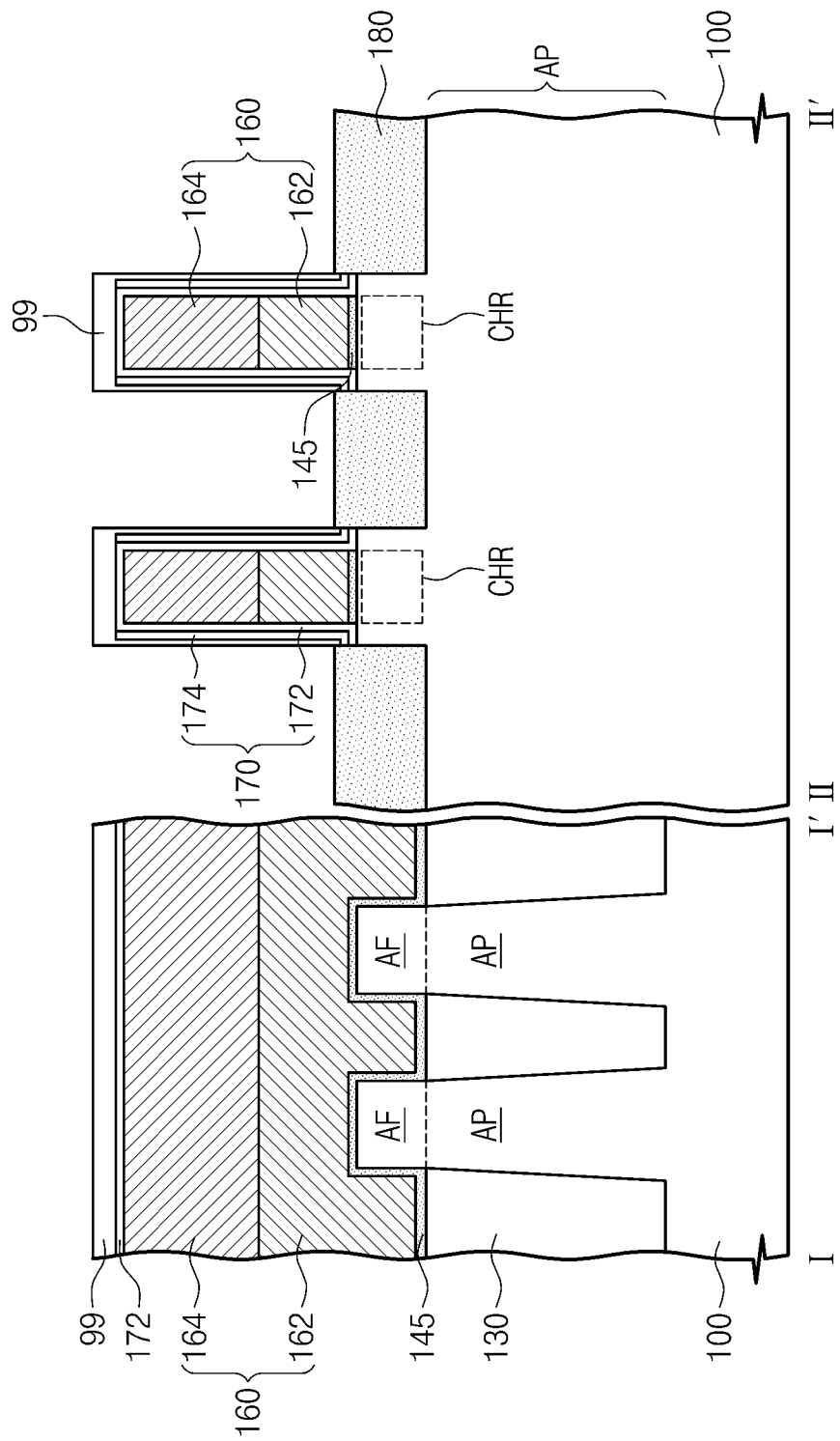

Referring to FIGS. 15, 19A, and 19B, source/drain electrodes 180 are formed at both sides of the sacrificial gate pattern 160 (S50). The source/drain electrodes 180 may be formed in regions where the source/drain regions SDR are recessed. Thus, the channel region CHR of the active fin AF may be disposed between the source/drain electrodes 180.

The formation process of the source/drain electrodes 180 may include growing an epitaxial layer from exposed surfaces of the active pattern AP by a selective epitaxial growth technique. In some embodiments, the epitaxial layer may be formed of a material capable of providing compressive strain to the channel region CHR. For example, the epitaxial layer may be formed of silicon-germanium (SiGe).

According to the present embodiment, the second gate spacer 174 may be formed of a silicon nitride-based material. However, since an exposed surface of the second gate spacer 174 is covered with the growth-inhibiting layer 99, the epitaxial layer may be selectively grown from the exposed surface of the active pattern AP.

Figure 20A:
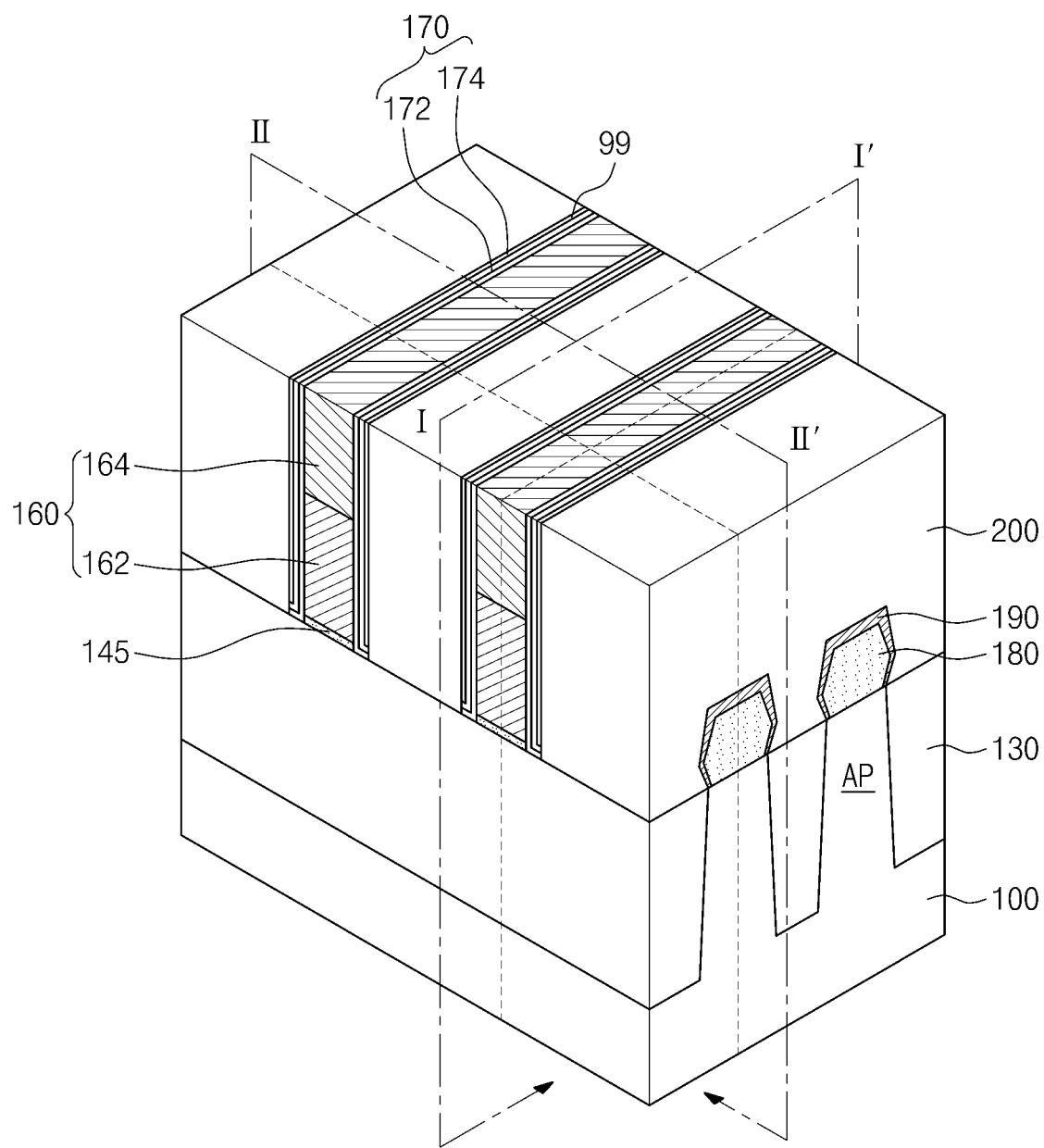
Figure 20B:
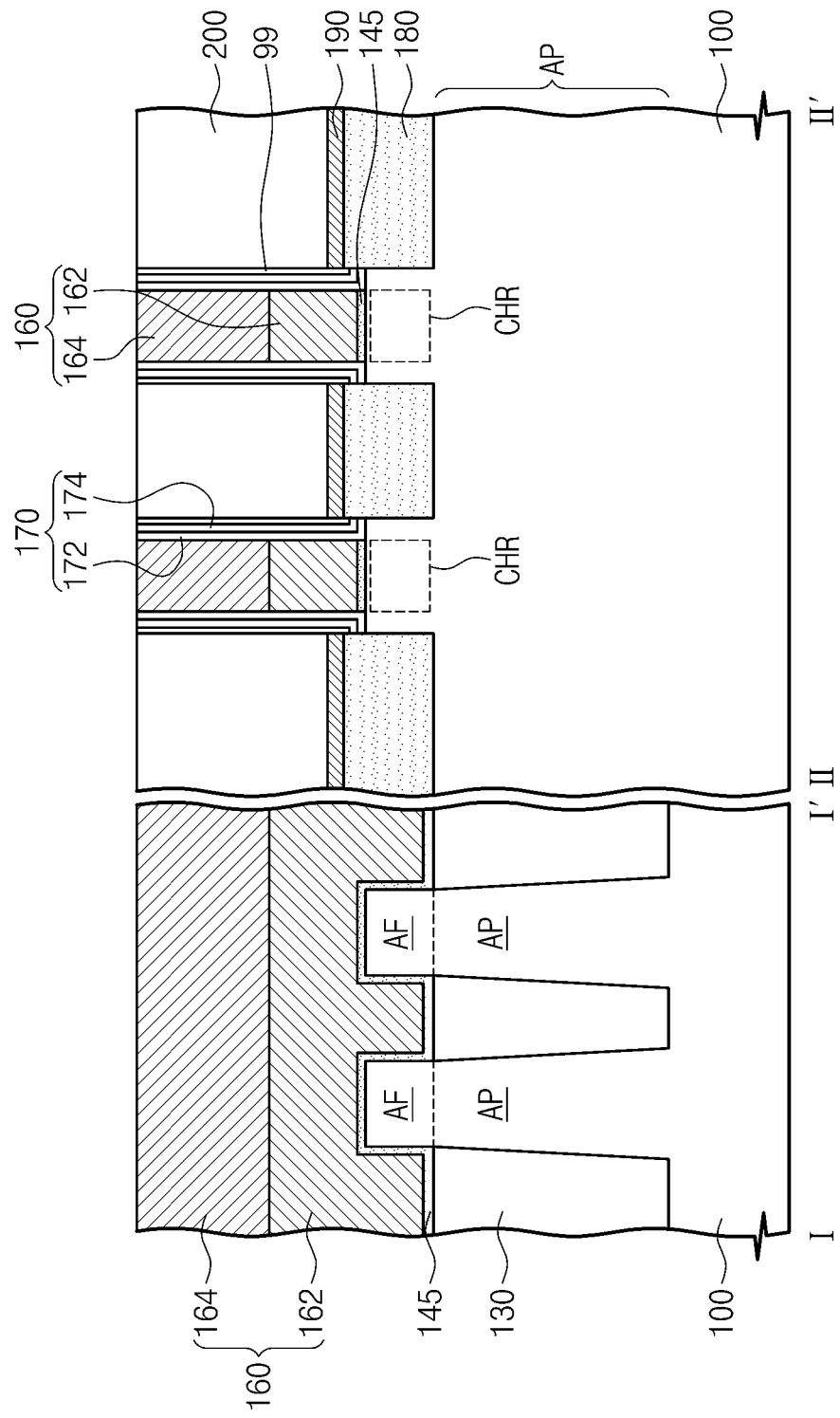

Referring to FIGS. 15, 20A, and 20B, the silicide patterns 190 are formed on exposed surfaces of the source/drain electrodes 180 (S60), and a lower interlayer insulating layer 200 is formed to cover the structure including the silicide patterns 190. These processes may be performed using the processes with reference to FIGS. 12A and 12B.

Figure 21A:
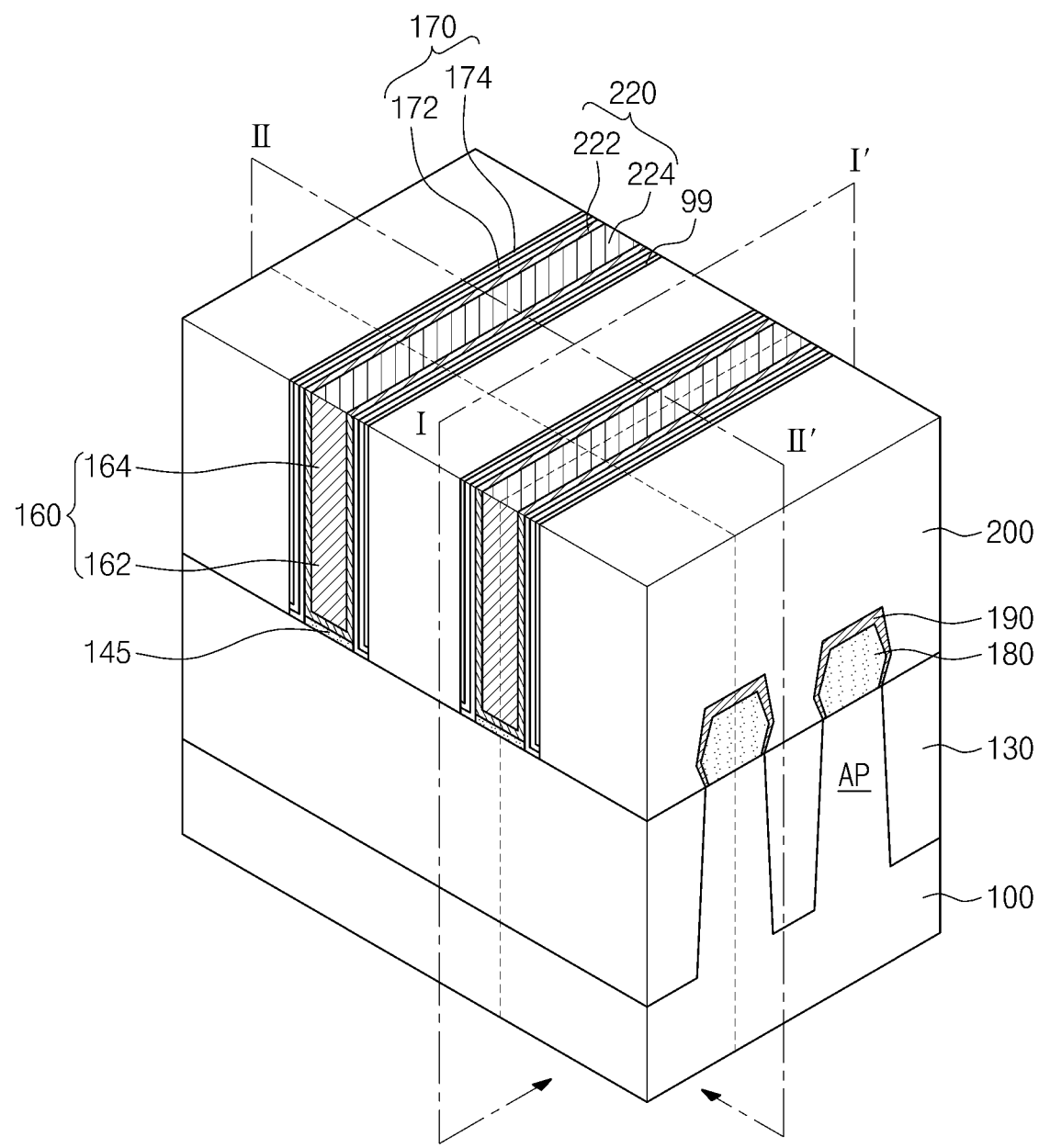
Figure 21B:
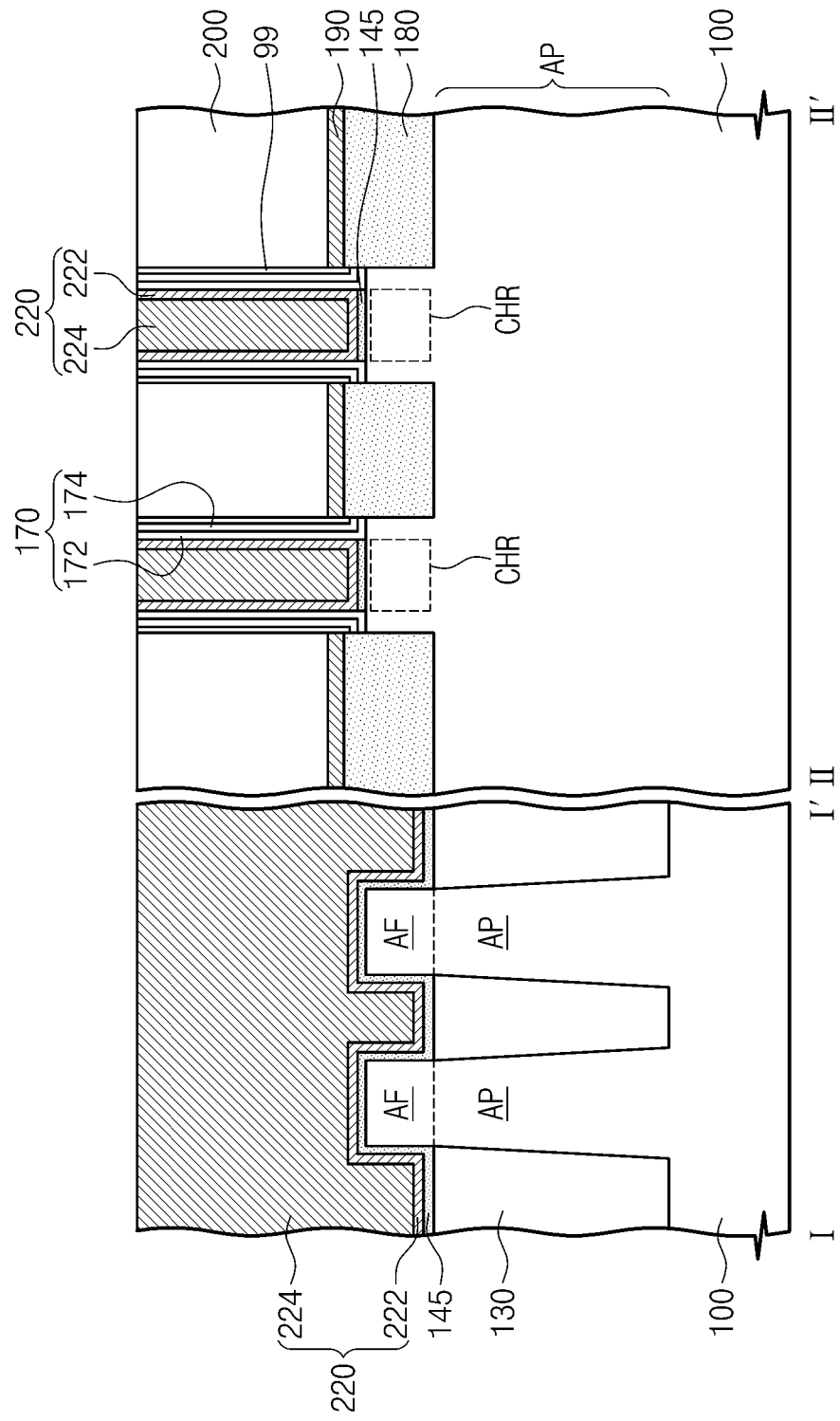

Referring to FIGS. 15, 21A, and 21B, the sacrificial gate pattern 160 is removed to form a gap region between the gate spacers 170, and a gate electrode 220 is then formed to fill the gap region (S70). Subsequently, an interconnection structure is formed to be electrically connected to the source/drain electrodes 180 through the silicide patterns 190 (S80). These processes may be performed using the processes described with reference to FIGS. 13A and 13B.

In some embodiments, the sacrificial gate pattern 160 may be used as a gate electrode of a field effect transistor. In this case, the removal of the sacrificial gate pattern 160 and the formation of the gate electrode 220 may be omitted, and the first sacrificial pattern 162 may be formed to include at least one conductive material.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory.

Figure 22:
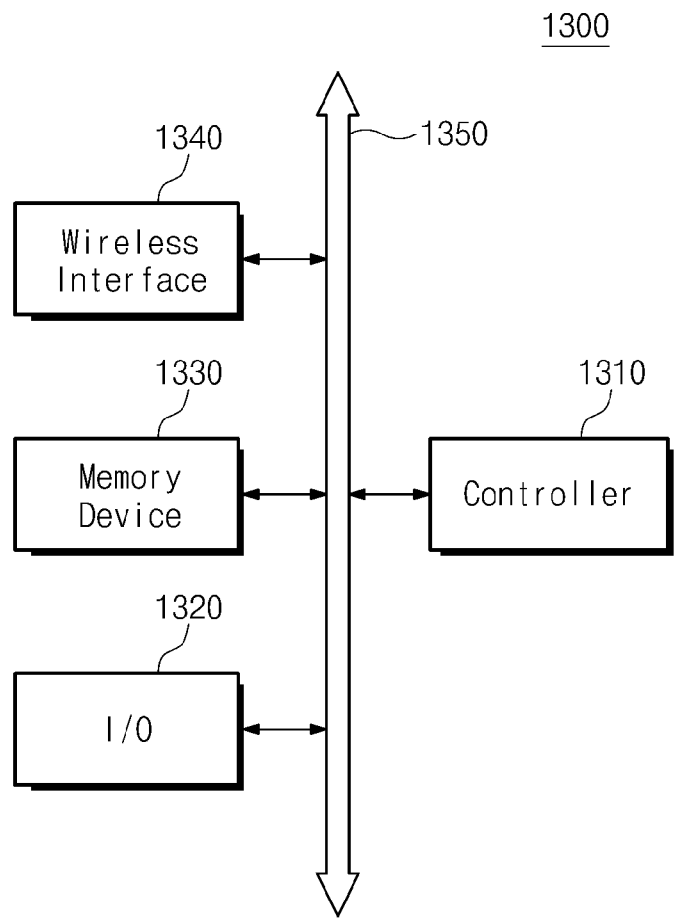
FIGS. 22 and 23 are schematic block diagrams illustrating electronic devices including semiconductor devices according to embodiments of the inventive concepts.
Figure 23:
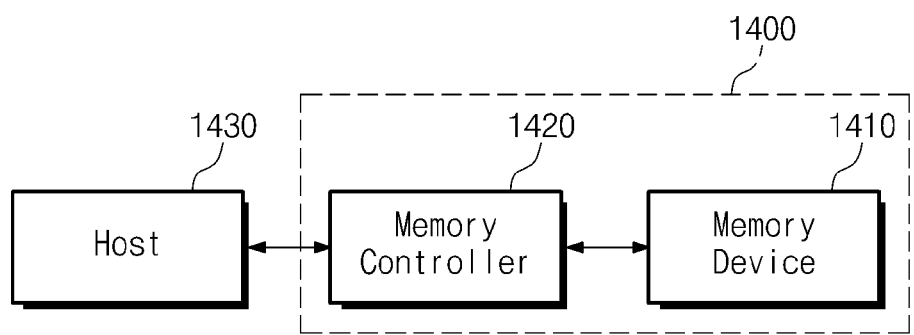

FIGS. 22 and 23 are schematic block diagrams illustrating electronic devices including semiconductor devices according to embodiments of the inventive concepts.

Referring to FIG. 22, an electronic device 1300 including the semiconductor device according to the embodiments of the inventive concepts may be one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 which are coupled to each other through a data bus 1350. For example, the controller 1310 may include at least one of a microprocessor, a digital signal processor, a microcontroller, or another logic device having a similar function to any one thereof. The memory device 1330 may store, for example, commands executed by the controller 1310. In addition, the memory device 1330 may store data of a user. The memory device 1330 may include at least one of the semiconductor devices according to the aforementioned embodiments of the inventive concepts. The electronic device 1300 may use the wireless interface unit 1340 for transmitting data to a wireless communication network communicating with a radio frequency (RF) signal and/or for receiving data from the network. For example, the wireless interface unit 1340 may include antenna or a wireless transceiver. The electronic device 1300 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 23, the semiconductor devices according to embodiments of the inventive concepts may be used to realize memory systems. A memory system 1400 may include a memory device 1410 and a memory controller 1420 for storing massive data. The memory controller 1420 may control the memory device 1410 to read/write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to the above embodiments of the inventive concepts.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device. A chip or package that includes the semiconductor devices, such as the fin structures described above, may also be referred to generally as a semiconductor device.

According to embodiments of the inventive concepts, the growth-inhibiting layer is formed to be thicker on the gate pattern than on the active pattern by the plasma oxidation process. The growth-inhibiting layer includes the material capable of inhibiting growth of the epitaxial layer used as the source/drain electrodes. Since the growth-inhibiting layer has the thickness difference according to the height and includes the material capable of inhibiting the growth of the epitaxial layer, the epitaxial layer may be selectively grown on the source/drain regions without a problem that the epitaxial layer is grown on the gate pattern.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
    patterning a substrate to form an active pattern;
    forming a gate pattern intersecting the active pattern;
    forming a gate spacer on a sidewall of the gate pattern;
    forming a growth-inhibiting layer covering an upper region of the gate pattern; and
    forming source/drain electrodes at opposite first and second sides of the gate pattern,
    wherein the growth-inhibiting layer is formed by a plasma oxidation process and forming the growth-inhibiting layer comprises:
        forming a preliminary growth-inhibiting layer on an upper portion of the gate pattern and on an upper portion of the active pattern, the preliminary growth-inhibiting layer being thicker on the upper portion of the gate pattern than on the upper portion of the active pattern; and
        performing an etching process to expose the upper portion of the active pattern,
    wherein the source/drain electrodes are grown from the exposed portions of the active pattern by an epitaxial technique.

2. The method of claim 1, wherein the gate pattern comprises a gate dielectric pattern, a first gate pattern, and a second gate pattern which are sequentially stacked,
    wherein the gate dielectric pattern includes at least one of hafnium oxide, hafnium silicate, zirconium oxide, or zirconium silicate, and
    wherein the second gate pattern includes a silicon nitride-based material.

3. The method of claim 2, wherein the gate pattern has a sidewall, and forming the gate spacer comprises:
    forming a first gate spacer layer covering the sidewall of the gate pattern;
    forming a second gate spacer layer covering the first gate spacer layer; and
    etching the first and second gate spacer layers to form first and second spacers exposing portions of the active pattern, the exposed portions of the active pattern disposed at the opposite first and second sides of the gate pattern,
    wherein the first gate spacer layer includes a silicon nitride-based material, and
    wherein the second gate spacer layer includes a silicon oxycarbonitride (SiOCN)-based material.

4. The method of claim 3, wherein the first gate spacer exposes an upper portion of the second gate pattern,
    wherein the second gate spacer exposes an upper portion of the first gate spacer, and
    wherein the plasma oxidation process converts the exposed portions of the second gate pattern and the first gate spacer into an oxide-based material.

5. The method of claim 4, wherein the oxide-based material includes silicon oxynitride.

6. The method of claim 3, further comprising:
    recessing the exposed portions of the active pattern disposed at the opposite first and second sides of the gate pattern after the formation of the first and second gate spacers,
    wherein the growth-inhibiting layer exposes the recessed portions of the active pattern.

7. The method of claim 2, further comprising:
    sequentially forming first and second gate spacer layers covering the gate pattern before the formation of the growth-inhibiting layer, wherein forming the gate spacer comprises etching the first and second gate spacer layers to form first and second gate spacers exposing portions of the active pattern disposed at the opposite first and second sides of the gate pattern.

8. The method of claim 7, wherein the first gate spacer layer includes a silicon oxide-based material, and
wherein the second gate spacer layer includes a silicon nitride-based material or a silicon oxycarbonitride (SiOCN)-based material.

9. The method of claim 8, wherein the plasma oxidation process converts an upper portion of the second gate spacer layer into an oxide-based material.

10. The method of claim 7, further comprising:
recessing the exposed portions of the active pattern disposed at the opposite first and second sides of the gate pattern after the formation of the growth-inhibiting layer,
wherein the growth-inhibiting layer is formed to expose the recessed portions of the active pattern.

11. The method of claim 10, wherein the growth-inhibiting layer is formed to cover an outer sidewall of the gate spacer.

12. The method of claim 1, wherein the plasma oxidation process is performed at a chamber pressure in a range of 1 Torr to 30 Torr without applying a back-bias.

13. The method of claim 1, wherein the growth-inhibiting layer on the gate pattern has a thickness in a range of about 40 Å to about 200 Å.

14. The method of claim 1, further comprising:
removing at least a portion of the gate pattern to form a gap region after the formation of the source/drain electrodes; and
forming a gate electrode filling the gap region.

15. The method of claim 1, wherein the growth-inhibiting layer exposes portions of the active pattern which are disposed at the opposite first and second sides of the gate pattern,
wherein forming the source/drain electrodes comprises:
growing silicon-geranium patterns from the exposed portions of the active pattern, and
wherein the growth-inhibiting layer is formed of a material capable of inhibiting growth of the silicon-germanium pattern.

16. A method of manufacturing a semiconductor device, the method comprising:
providing a substrate having an active pattern;
forming a gate pattern intersecting the active pattern;
forming a gate spacer on a sidewall of the gate pattern;
forming a growth-inhibiting pattern covering an upper region of the gate pattern and exposing portions of the active pattern disposed at opposite first and second sides of the gate pattern; and
forming source/drain patterns at the exposed portions of the active pattern,
wherein forming the growth-inhibiting pattern comprises:
forming a preliminary growth-inhibiting layer on the gate pattern and on the active pattern, wherein the preliminary growth-inhibiting layer disposed on the gate pattern is thicker than the preliminary growth-inhibiting pattern disposed on the active pattern; and
removing the preliminary growth-inhibiting layer disposed on the active pattern to expose the portions of the active pattern.

17. The method of claim 16, wherein the gate pattern comprises a gate dielectric pattern, a first gate pattern, and a second gate pattern which are sequentially stacked, wherein the second gate pattern includes a silicon nitride-based material,
wherein forming the preliminary growth-inhibiting pattern comprises converting an upper portion of the second gate pattern into an oxide-based material by a plasma oxidation process.

18. The method of claim 17, wherein the gate spacer comprises a first gate spacer and a second gate spacer which are sequentially stacked, wherein one of the first gate spacer and the second gate spacer includes a silicon nitride-based material,
wherein forming the preliminary growth-inhibiting pattern comprises converting an exposed portion of the one of the first and the second gate spacers into an oxide-based material by the plasma oxidation process.

19. The method of claim 16, wherein forming the source/drain patterns comprises growing silicon-geranium patterns from the exposed portions of the active pattern by an epitaxial technique.

* * * * *